US00RE44644E

(19) United States
(12) Reissued Patent
Mugler, III et al.

(10) Patent Number: US RE44,644 E
(45) Date of Reissued Patent: Dec. 17, 2013

(54) METHOD AND APPARATUS FOR SPIN-ECHO-TRAIN MR IMAGING USING PRESCRIBED SIGNAL EVOLUTIONS

(75) Inventors: John P. Mugler, III, Charlottesville, VA (US); James R. Brookeman, Charlottesville, VA (US)

(73) Assignee: University of Virginia Patent Foundation, Charlottesville, VA (US)

(21) Appl. No.: 12/354,471

(22) Filed: Jan. 15, 2009

Related U.S. Patent Documents

Reissue of:
(64) Patent No.: 7,164,268
Issued: Jan. 16, 2007
Appl. No.: 10/451,124
PCT Filed: Dec. 21, 2001
PCT No.: PCT/US01/50551
§ 371 (c)(1),
(2), (4) Date: Jun. 19, 2003
PCT Pub. No.: WO02/50574
PCT Pub. Date: Jun. 27, 2002

U.S. Applications:
(60) Provisional application No. 60/257,182, filed on Dec. 21, 2000.

(51) Int. Cl.
*G01R 33/50* (2006.01)
*A61B 5/055* (2006.01)
*G01V 3/00* (2006.01)

(52) U.S. Cl.
USPC ..... 324/307; 324/314; 324/309; 324/318; 600/410; 600/413; 600/425; 600/428

(58) Field of Classification Search
USPC ..... 324/300–322; 600/407–435; 382/128–131
See application file for complete search history.

(56) References Cited

U.S. PATENT DOCUMENTS

| | | | | |
|---|---|---|---|---|
| 4,695,800 | A | 9/1987 | Kramer | |
| 4,703,271 | A | 10/1987 | Loeffler | |
| 4,769,603 | A | 9/1988 | Oppelt | |
| 4,818,940 | A | 4/1989 | Hennig | |
| 4,901,020 | A | 2/1990 | Ladebeck | |
| 5,001,428 | A | 3/1991 | Maier | |
| 5,214,382 | A | 5/1993 | Harms | |
| 5,235,280 | A | 8/1993 | Deimling | |
| 5,245,282 | A * | 9/1993 | Mugler et al. | 324/309 |
| 5,256,967 | A | 10/1993 | Foo | |
| 5,270,654 | A | 12/1993 | Feinberg | |
| 5,304,929 | A | 4/1994 | Fang | |
| 5,315,249 | A * | 5/1994 | Le Roux et al. | 324/309 |
| 5,345,176 | A * | 9/1994 | LeRoux et al. | 324/309 |
| 5,347,216 | A * | 9/1994 | Foo | 324/309 |

(Continued)

OTHER PUBLICATIONS

Hennig, J., "RARE Imaging: A Fast Imaging Method for Clinical MR", Magnetic Resonance in Medicine, 1986, vol. 3, p. 823-833.

(Continued)

*Primary Examiner* — Melissa Koval
*Assistant Examiner* — Tiffany Fetzner
(74) *Attorney, Agent, or Firm* — Robert J. Decker

(57) ABSTRACT

A magnetic resonance imaging "MRI" method and apparatus for lengthening the usable echo-train duration and reducing the power deposition for imaging is provided. The method explicitly considers the t1 and t2 relaxation times for the tissues of interest, and permits the desired image contrast to be incorporated into the tissue signal evolutions corresponding to the long echo train. The method provides a means to shorten image acquisition times and/or increase spatial resolution for widely-used spin-echo train magnetic resonance techniques, and enables high-field imaging within the safety guidelines established by the Food and Drug Administration for power deposition in human MRI.

256 Claims, 8 Drawing Sheets

(TOTAL NUMBER OF ECHOES FOR SIGNAL EVOLUTION = 160)
(ECHO SPACING = 4.1 MILLISECONDS. TIME FROM EXCITATION RF PULSE TO A GIVEN ECHO NUMBER = ECHO NUMBER x 4.1 MILLISECONDS.)

(AMENDED)

(56) References Cited

U.S. PATENT DOCUMENTS

| | | | | |
|---|---|---|---|---|
| 5,391,990 | A | 2/1995 | Schmitt | |
| 5,402,067 | A | 3/1995 | Pauly | |
| 5,541,511 | A | 7/1996 | Hennig | |
| 5,541,514 | A | 7/1996 | Heid | |
| 5,545,992 | A | 8/1996 | Foo | |
| 5,565,776 | A | 10/1996 | Kanazawa | |
| 5,612,619 | A | 3/1997 | Feinberg | |
| 5,680,045 | A | 10/1997 | Feinberg | |
| 5,749,834 | A | 5/1998 | Hushek | |
| 6,020,739 | A | 2/2000 | Meyer | |
| 6,230,039 | B1 | 5/2001 | Stuber | |
| 6,404,194 | B1 | 6/2002 | Irarrazabal | |
| 6,456,071 | B1 | 9/2002 | Hennig | |
| 6,472,870 | B1 * | 10/2002 | Bendall et al. | 324/307 |
| 6,850,063 | B2 | 2/2005 | Hennig | |
| 6,956,374 | B2 | 10/2005 | Busse | |
| 7,164,268 | B2 * | 1/2007 | Mugler et al. | 600/410 |
| 7,425,828 | B2 * | 9/2008 | Garwood et al. | 324/310 |
| 7,847,551 | B2 * | 12/2010 | Park | 324/309 |
| 8,040,135 | B1 * | 10/2011 | Cukur et al. | 324/309 |
| 8,067,936 | B2 * | 11/2011 | Garwood et al. | 324/307 |
| 8,228,060 | B2 * | 7/2012 | Busse | 324/307 |
| 8,258,786 | B2 * | 9/2012 | Hennel | 324/309 |
| 2004/0051527 | A1 * | 3/2004 | Mugler et al. | 324/309 |
| 2004/0090230 | A1 * | 5/2004 | Appel et al. | 324/307 |
| 2008/0319301 | A1 * | 12/2008 | Busse | 600/410 |
| 2010/0013479 | A1 * | 1/2010 | Park | 324/309 |
| 2011/0288402 | A1 * | 11/2011 | Pikkemaat et al. | 600/420 |

OTHER PUBLICATIONS

Mulkern, R.V., "Contrast Manipulation and Artifact Assessment of 2D and 3D Rare Sequences", Magnetic Resonance Imaging, 1990, vol. 8, p. 557-566.

Melki, P.S., "Partial RF Echo Planar Imaging with the Faise Method. I. Experimental and Theoretical Assessment of Artifact", Magnetic Resonance in Medicine, 1992, vol. 26, p. 328-341.

Jones, K.M., "Fast Spin-Echo MR Imaging of the Brain and Spine: Current Concepts", AJR 1992, 158, p. 1313-1320.

Feinberg, D.A., "Grase (Gradient—and Spin-Echo) MR Imaging: A New Fast Clinical Imaging Technique", Radiology, 1991, vol. 181, No. 2, p. 597-602.

Oshio, K., "GRASE (Gradient—and Spin-Echo) Imaging: A Novel Fast MRI Technique", Magnetic Resonance in Medicine, 1991, vol. 20, p. 344-349.

Hajnal, J.V., "Use of Fluid Attenuated Inversion Recovery (FLAIR) Pulse Sequences in MRI of the Brain", Journal of Computer Assisted Tomography, 1992, vol. 16, No. 6, p. 841-844.

Constable, R.T., "The Loss of Small Objects in Variable TE Imaging: Implications for FSE, RARE, and EPI", Magnetic Resonance in Medicine, 1992, vol. 28, p. 9-24.

Ortendahl, D.A., "Analysis of Hybrid Imaging Techniques", Magnetic Resonance in Medicine, 1992, vol. 26, p. 155-173.

Hennig, J., "Multiecho Imaging Sequences with Low Refocusing Flip Angles", Journal of Magnetic Resonance, 1988, vol. 78, p. 397-407.

Alsop, D.C., "The Sensitivity of Low Flip Angle Rare Imaging", Magnetic Resonance in Medicine, 1997, vol. 37, p. 176-184.

Hittmair, K., "Spinal Cord Lesions in Patients with Multiple Sclerosis: Comparison of MR Pulse Sequences", American Journal of Neuroradiology, 1996, vol. 17, p. 1555-1565.

Keiper, M.D., "The Low Sensitivity of Fluid-Attenuated Inversion-Recovery MR in the Detection of Multiple Sclerosis of the Spinal Cord", American Journal of Neuroradiology, 1997, vol. 18, p. 1035-1039.

Haacke, E.M., "Magnetic Resonance Imaging: Physical Principles and Sequence Design", John Wiley & Sons, New York, 1999, p. 51-64.

Forsythe, G.E., "Computer Methods for Mathematical Computations", Prentice-Hall, Englewood Cliffs, N. J., 1977, p. 156-177.

Le Roux, P., "Stabilization of Echo Amplitudes in FSE Sequences", Magnetic Resonance in Medicine, 1993, vol. 30, p. 183-190.

Hennig, J., Medicine, "Easy Improvement of Signal-to-Noise in RARE Sequences with Low Refocusing Flip Angles", Magnetic Resonance in Medicine, 2000, vol. 44, p. 983-985.

Hennig, J., "Hyperechoes", Magnetic Resonance in Medicine, 2001, vol. 46, p. 6-12.

Hennig, J., "Multiecho Sequences with Variable Refocusing Flip Angles: Optimization of Signal Behavior Using Smooth Transitions Between Pseudo Steady States (TRAPS)", Magnetic Resonance in Medicine, 2003, vol. 49, p. 527-535.

Glover, G.H., "Reduction of Non-Equilibrium Effects in Rare Sequences", Works in Progress Book of Abstracts, Tenth Annual Scientific Meeting and Exhibition, Society of Magnetic Resonance in Medicine, 1991, San Francisco. p. 1242.

Schäffter, T., "PSF Improvements in Single Shot GRASE Imaging", Proceedings of the Society of Magnetic Resonance, 1994. Second Meeting, San Francisco. p. 27.

Mugler, III, J.P., "T1-Weighted and T2-Weighted 3D Spin-Echo-Based Imaging of the Whole Brain: 1 mm3 Resolution in Under 10 Minutes", Proceedings of the International Society for Magnetic Resonance in Medicine, 1998. Sixth Meeting, Sydney. p. 1959.

Mugler, III, J.P., "Single-Slab Three-Dimensional FLAIR Imaging of the Brain", Proceedings of the International Society for Magnetic Resonance in Medicine, 1999. Seventh Meeting, Philadelphia. p. 8.

Mugler, III, J.P., "Three-Dimensional Spin-Echo-Train Proton-Density-Weighted Imaging Using Shaped Signal Evolutions", Proceedings of the International Society for Magnetic Resonance in Medicine, 1999. Seventh Meeting, Philadelphia. p. 1631.

Mugler, III, J.P., "Motion-Artifact-Free T2-Weighted 3D Imaging of the Cervical Spine", Proceedings of the International Society for Magnetic Resonance in Medicine, 2000. Eighth Meeting, Denver. p. 402.

Mugler, III, J.P., "Three-Dimensional T2-Weighted Imaging of the Brain Using Very Long Spin-Echo Trains", Proceedings of the International Society for Magnetic Resonance in Medicine, 2000. Eighth Meeting, Denver. p. 687.

Hennig, J., "Hyperechoes—Basic Principles and Applications", Proceedings of the International Society for Magnetic Resonance in Medicine, 2001. Ninth Meeting, Glasgow. p. 437.

Mugler, III, J.P., "T2-Weighted 3D Spin-Echo Train Imaging of the Brain at 3 Tesla: Reduced Power Deposition Using Low Flip-Angle Refocusing RF Pulses", Proceedings of the International Society for Magnetic Resonance in Medicine, 2001. Ninth Meeting, Glasgow. p. 438.

Hennig, J., "Hyperechoes in RARE(TSE, FSE )—Sequences", Proceedings of the International Society for Magnetic Resonance in Medicine, 2001. Ninth Meeting, Glasgow. p. 1769.

Busse, R.F., "Reducing SAR in Real-Time SSFSE Imaging with Variable-Flip Hard Refocusing RF Pulses", Proceedings of the International Society for Magnetic Resonance in edicine, 2001. Ninth Meeting, Glasgow. p. 1790.

Elster, et al., "Questions and Answers in Magnetic Resonance Imaging", 2001, 2 ed., p. 102-103.

Kallmes, et al., "Suppression of Cerebrospinal Fluid and Blood Flow Artifacts in Flair MR Imaging with a SingleSlab Three-dimensional Pulse Sequence: Initial Experience", Radiology 2001, vol. 221, No. 1, p. 221-255.

Mugler III, et al., "Optimized Single-Slab Three-dimensional Spin-Echo MR Imaging of the Brain", Radiology 2000, vol. 216, No. 3, p. 891-899.

Tkach et al., article "A comparison of fast spin echo and gradient field echo sequences" Magnetic Resonance Imaging (Jul.-Aug. 1988) vol. 6, No. 4, p. 373-89.*

* cited by examiner

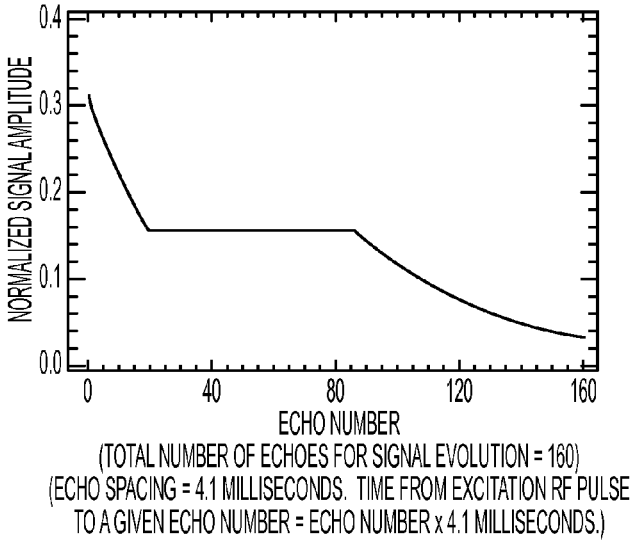
FIG. 2 (AMENDED)

METHOD AND APPARATUS FOR SPIN-ECHO-TRAIN MR IMAGING USING PRESCRIBED SIGNAL EVOLUTIONS

Matter enclosed in heavy brackets [ ] appears in the original patent but forms no part of this reissue specification; matter printed in italics indicates the additions made by reissue.

RELATED APPLICATIONS

This application is a national stage filing of International Application No. PCT/US01/50551, filed 21 Dec. 2001, which claims benefit under 35 U.S.C. Section 119(e) from U.S. Provisional Application Ser. No. 60/257,182, filed on Dec. 21, 2000, entitled "Spin-Echo-Train MR Imaging Using Prescribed Signal Evolutions," the entire disclosure of which is hereby incorporated by reference herein. The present application is related to U.S. Pat. No. 5,245,282, filed on Jun. 28, 1991, entitled "Three-dimensional Magnetic Resonance Imaging," the entire disclosure of which is hereby incorporated by reference herein.

GOVERNMENT SUPPORT

Work described herein was supported by Federal Grant Number NS-35142, awarded by the National Institutes of Health. The United States Government possesses certain rights in and to this invention.

FIELD OF INVENTION

The present invention relates to a pulse sequence for use in operating a magnetic resonance imaging apparatus, and in particular for lengthening the usable echo-train duration and reducing the power deposition for spin-echo-train magnetic resonance imaging.

BACKGROUND OF INVENTION

Over the past twenty years, nuclear magnetic resonance imaging (MRI) has developed into an important modality for both clinical and basic-science imaging applications. A large portion of MRI techniques are based on spin-echo (SE) acquisitions because they provide a wide range of useful image contrast properties that highlight pathological changes and are resistant to image artifacts from a variety of sources such as radio-frequency or static-field inhomogeneities.

Spin-echo-based methods can be subdivided into two categories, including those that generate one spin echo for each desired image contrast following each excitation radio-frequency (RF) pulse, and those that generate more than one spin echo for each desired image contrast following each excitation RF pulse. The first category includes, but is not limited thereto, the techniques commonly referred to as "conventional SE" imaging. The second category includes, but is not limited thereto, a method called "RARE" (See Hennig J., Nauerth A., Friedburg H., "RARE Imaging: A Fast Imaging Method for Clinical MR", Magn. Reson. Med. 1986, 3:823-833; and Mulkern R. V., Wong S. T. S., Winalski C., Jolesz F. A., "Contrast Manipulation and Artifact Assessment of 2D and 3D RARE Sequences", Magn. Reson. Imaging 1990, 8:557-566, of which are hereby incorporated by reference in their entirety) and its derivatives, commonly referred to as "turbo-SE" or "fast-SE" imaging (See Melki P. S., Jolesz F. A., Mulkern R. V., "Partial RF Echo Planar Imaging with the FAISE Method. I Experimental and Theoretical Assessment of Artifact", Magn. Reson. Med. 1992, 26:328-341 and Jones K. M., Mulkern R. V., Schwartz R. B., Oshio K., Barnes P. D., Jolesz F. A., "Fast Spin-Echo MR Imaging of the Brain and Spine: Current Concepts", AJR 1992, 158:1313-1320, of which are hereby incorporated by reference in their entirety). For the purposes of this disclosure, we are primarily interested in the generalized form of techniques in the second category; however the present invention is applicable to the first category as well. The term "generalized" refers to the form of the spatial-encoding gradients that are applied following any given refocusing RF pulse. For example, RARE imaging encodes one line of spatial-frequency space (k-space) data following each refocusing RF pulse using a constant, frequency-encoding magnetic field gradient. In contrast, "GRASE" imaging (See Feinberg D. A., Oshio K. "GRASE (Gradient- And Spin-Echo) MR Imaging: A New Fast Clinical Imaging Technique", Radiology 1991, 181: 597-602; and Oshio K., Feinberg D. A. "GRASE (Gradient-And Spin-Echo) Imaging: A Novel Fast MRI Technique", Magn. Reson. Med. 1991, 20:344-349, of which are hereby incorporated by reference in their entirety) encodes three or more lines of k-space data following each refocusing RF pulse using an oscillating, frequency-encoding gradient waveform. This oscillating gradient waveform collects one line of k-space data that includes the spin echo, and one or more additional lines of k-space data before the spin echo and after the spin echo. One skilled in the art would appreciate that there exist an infinite number of possibilities for spatially encoding the MR signal following each refocusing RF pulse. For the purpose of this disclosure, we define the term "spin-echo-train" imaging to encompass all of these possibilities, including, but not limited thereto, RARE, turbo-SE, fast-SE and GRASE imaging, because the present invention deals with, among other things, the RF-pulse history during the echo train, not the details of the spatial encoding.

In general, one of the major goals of technique development for MRI has been to increase the amount of k-space data sampled per unit time, under the constraints of obtaining the desired image contrast and maintaining image artifacts at a tolerable level. Increases in the data rate are typically traded for a decrease in the image acquisition time and/or an increase in the spatial resolution. In this respect, spin-echo-train methods have played an important role; fast-SE imaging is routinely and widely used in clinical MRI.

For instance, the echo trains used in clinical fast-SE imaging generally employ high flip angles (>100°) for the refocusing RF pulses, and their durations are typically less than the T2 relaxation times of interest for short effective echo times (e.g., T1 or proton-density weighting*; effective echo time is the time period from the excitation RF pulse to the collection of data corresponding to substantially zero-spatial frequency* (*the center of k space*) or less than two to three times these T2 values for long effective echo times (e.g., T2 weighting or "FLAIR"; see Hajnal J. V., Bryant D. J., Kasuboski L., Pattany P. M., De Coene B., Lewis P. D., Pennock J. M., Oatridge A., Young I. R., Bydder G. M., "Use of Fluid Attenuated Inversion Recovery (FLAIR) Pulse Sequences in MRI of the Brain", J. Comput. Assist. Tomogr. 1992, 16:841-844, of which is hereby incorporated by reference in its entirety). For example, considering brain imaging at 1.5 Tesla, these limits translate to echo-train durations of <100 ms and <300 ms for short and long effective echo times, respectively. When high flip angles are used for the refocusing RF pulses, echo-train durations that are longer than these limits can substantially degrade image contrast and introduce artifacts such as blurring (See Mulkern et al.; Melki et al.;

Constable R. T., Gore J. C., "The Loss of Small Objects in Variable TE Imaging: Implications for FSE, RARE and EPI", Magn. Reson. Med. 1992, 28:9-24; and Ortendahl D. A., Kaufman L., Kramer D. M., "Analysis of Hybrid Imaging Techniques", Magn. Reson. Med. 1992, 26:155-173, of which are hereby incorporated by reference in their entirety).

Nonetheless, if it were possible to substantially lengthen echo-train durations beyond these limits, while achieving the desired image contrast and limiting artifacts, it would represent a useful and widely applicable advance.

Preliminary studies with the goal of lengthening the echo-train duration in spin-echo-train-based acquisitions have been performed by other researchers. Over a decade ago, Hennig (See Hennig J., "Multiecho Imaging Sequences with Low Refocusing Flip Angles", J. Magn. Reson. 1988, 78:397-407, of which is hereby incorporated by reference in its entirety) proposed the use of constant, low-flip-angle refocusing RF pulses to introduce a T1 dependence to the evolution of the echo train and thereby lengthen its usable duration. More recently, this concept was extended by Alsop, who derived variable flip-angle series based on the "pseudosteady-state" condition of a constant signal level when T1 and T2 relaxation are neglected (See Alsop D. C., "The Sensitivity of Low Flip Angle RARE Imaging", Magn. Reson. Med. 1997; 37:176-184, of which is hereby incorporated by reference in its entirety). Alsop also found that the echo-train performance was improved by using a signal evolution that decreased for the first few echoes and was then constant, instead of being constant for the complete echo train. Using these evolutions, artifact-free human brain images with T2-weighting were acquired by Alsop. An 80-echo train with a duration of 400 ms and asymptotic flip angles ranging from 17° to 90° were used.

Turning to the present invention, a method and related apparatus is provided for lengthening the usable echo-train duration for spin-echo-train imaging substantially beyond that achievable with the constant, low-flip-angle or pseudosteady-state approaches. The present invention method and apparatus explicitly consider the T1 and T2 relaxation times for the tissues of interest and thereby permit the desired image contrast to be incorporated into the tissue signal evolutions corresponding to the long echo train. Given the considerable role that spin-echo-train methods already play in MR imaging, the present invention methodology will be of significant importance.

SUMMARY OF THE INVENTION

This present invention comprises the methodology, related apparatus, and *non-transitory* computer useable medium (readable media) for using a series of refocusing RF pulses with variable flip angles and, optionally, variable phase angles, in a spin-echo-train MRI pulse sequence wherein the flip-angle series is specifically designed to achieve a prescribed signal evolution during the echo train for selected T1 and T2 relaxation times. By employing such a series of refocusing RF pulses, the usable duration of the echo train can be extended substantially beyond that obtainable with conventional methods. This increase in the echo-train duration can be used to decrease the image acquisition time and/or increase the spatial resolution.

In one aspect, the present invention features a method for generating a pulse sequence for operating a magnetic resonance imaging apparatus for imaging an object, the method comprising:

a) providing contrast-preparation, the contrast-preparation comprising generating at least one of at least one radio-frequency pulse, at least one magnetic-field gradient pulse, and at least one time delay, whereby the contrast preparation encodes the magnetization with at least one desired image contrast;

b) calculating flip angles and phases of refocusing radio-frequency pulses that are applied in a data-acquisition step, wherein the calculation provides desired prescribed signal evolution and desired overall signal level, the calculation comprises:
   i) selecting values of T1 and T2 relaxation times and selecting proton density;
   ii) selecting a prescribed time course of the amplitudes and phases of the radio-frequency magnetic resonance signals that are generated by the refocusing radio-frequency pulses; and
   ii) selecting characteristics of the contrast-preparation step, the data-acquisition step and a magnetization-recovery step, with the exception of the flip angles and phases of the refocusing radio-frequency pulses that are to be calculated; and c) providing the data acquisition step based on a spin echo train acquisition, the data-acquisition step comprises:
   i) an excitation radio-frequency pulse having a flip angle and phase;
   ii) at least two refocusing radio-frequency pulses, each having a flip angle and phase as determined by the calculation step; and
   iii) magnetic-field gradient pulses that encode spatial information into at least one of the radio-frequency magnetic resonance signals that follow at least one of the refocusing radio-frequency pulses;

d) providing magnetization-recovery, the magnetization-recovery comprises a time delay to allow magnetization to relax; and e) repeating steps (a) through (d) until a predetermined extent of spatial frequency space has been sampled.

In a second aspect, the present invention features a magnetic resonance imaging apparatus for generating a pulse sequence for operating the apparatus for imaging an object, the apparatus comprising a main magnet system for generating a steady magnetic field; a gradient magnet system for generating temporary gradient magnetic fields; a radio-frequency transmitter system for generating radio-frequency pulses; a radio-frequency receiver system for receiving magnetic resonance signals; a reconstruction unit for reconstructing an image of the object from the received magnetic resonance signals; and a control unit for generating signals controlling the gradient magnet system, the radio-frequency transmitter system, the radio-frequency receiver system, and the reconstruction unit, wherein the control unit generates signals causing:

a) providing contrast-preparation, the contrast-preparation comprising generating at least one of at least one radio-frequency pulse, at least one magnetic-field gradient pulse, and at least one time delay, whereby the contrast preparation encodes the magnetization with at least one desired image contrast;

b) calculating flip angles and phases of refocusing radio-frequency pulses that are applied in a data-acquisition step, wherein the calculation provides desired prescribed signal evolution and desired overall signal level, the calculation comprises:
   i) selecting values of T1 and T2 relaxation times and selecting proton density;
   ii) selecting a prescribed time course of the amplitudes and phases of the radio-frequency magnetic resonance signals that are generated by the refocusing radio-frequency pulses; and ii) selecting characteristics of the contrast-preparation step, the data-acquisition step and a magnetization-recovery step, with the exception of the flip angles and phases of the refocusing radio-frequency pulses that are to be calculated; and c) providing the data acquisition step based on a spin echo train acquisition, the data-acquisition step comprises:

i) an excitation radio-frequency pulse having a flip angle and phase, ii) at least two refocusing radio-frequency pulses, each having a flip angle and phase as determined by the calculation step, and iii) magnetic-field gradient pulses that encode spatial information into at least one of the radio-frequency magnetic resonance signals that follow at least one of the refocusing radio-frequency pulses;

d) providing magnetization-recovery, the magnetization-recovery comprises a time delay to allow magnetization to relax; and e) repeating steps (a) through (d) until a predetermined extent of spatial frequency space has been sampled.

In a third aspect, the present invention features a *non-transitory* computer readable media carrying encoded program instructions for causing a programmable magnetic resonance imaging apparatus to perform the method discussed above in the first aspect of the invention. Similarly, the invention features a *non-transitory* computer program product comprising a *non-transitory* computer useable medium having *non-transitory* computer program logic for enabling at least one processor in a magnetic resonance imaging apparatus to generate a pulse sequence, the *non-transitory* computer program logic comprising the method discussed above in the first aspect of the invention.

Because the flip angles for the refocusing RF pulses that are derived with this method are typically much less than 180° for a substantial portion of the total number of RF pulses, the power deposition is much less than that corresponding to 180° RF pulses, which are commonly used in conventional spin-echo-train pulse sequences. This feature is particularly important for high field MRI (>1.5 Tesla), wherein power deposition is a critical pulse-sequence design factor for human applications. The present invention permits long, closely-spaced echo trains to be used for high-field imaging that would not otherwise meet the safety guidelines established by the Food and Drug Administration for power deposition in human MRI.

Another potentially useful feature of the present invention is that, for specific forms of the encoding-gradient waveforms, signals from moving or flowing materials are strongly attenuated, even when the velocities are relatively low. A specific example of this behavior is the attenuation of the signal from cerebrospinal fluid (CSF) surrounding the cervical spinal cord due to its oscillatory motion, which can be used to generate CSF-suppressed T2-weighted MR images of the spinal cord without requiring inversion-nulling of the CSF signal. Studies have indicated that the full range of clinically-relevant cord lesions may not be adequately detected using inversion-nulling of the CSF signal (i.e., FLAIR) (See Hittmair K., Mallek R., Prayer D., Schindler E. G., Kollegger H., "Spinal Cord Lesions in Patients with Multiple Sclerosis: Comparison of MR Pulse Sequences", AJNR 1996, 17:1555-1565; and Keiper M. D., Grossman R. I., Brunson J. C., Schnall M. D., "The Low Sensitivity of Fluid-Attenuated Inversion-Recovery MR in the Detection of Multiple Sclerosis of the Spinal Cord", AJNR 1997, 18:1035-1039, of which are hereby incorporated by reference in their entirety).

These and other objects, along with advantages and features of the invention disclosed herein, will be made more apparent from the description, drawings and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings, in which:

FIG. 2 shows an example of a prescribed signal evolution that can be used to generate T2-weighted MR images of the brain or spine.

FIGS. [4-6] *4A-4F, 5A-5C, and 6* show example MR images obtained using the variable-flip-angle series of FIG. 3 in a "turbo-SE" type spin-echo-train pulse sequence; collectively, FIGS. [4-6] *4A-6* provide examples of the potential utility of the present invention. In particular, showing brain images obtained at 1.5 Tesla, FIGS. 4(A) and 4(B)-4(C) compare T2-weighted two-dimensional and three-dimensional SE images, respectively. Further, showing brain images obtained at 3 Tesla.

DETAILED DESCRIPTION OF THE INVENTION

In the following, first presented is an exemplary embodiment of a MR apparatus for practicing the MR methods of the present invention for imaging an object, moving or stationary. Following are descriptions of preferred and alternative embodiments of the methods of the present invention, including their exemplary implementation as *non-transitory* computer hardware, firmware, and/or software.

An Exemplary MR-Apparatus of the Present Invention

Figure 7:
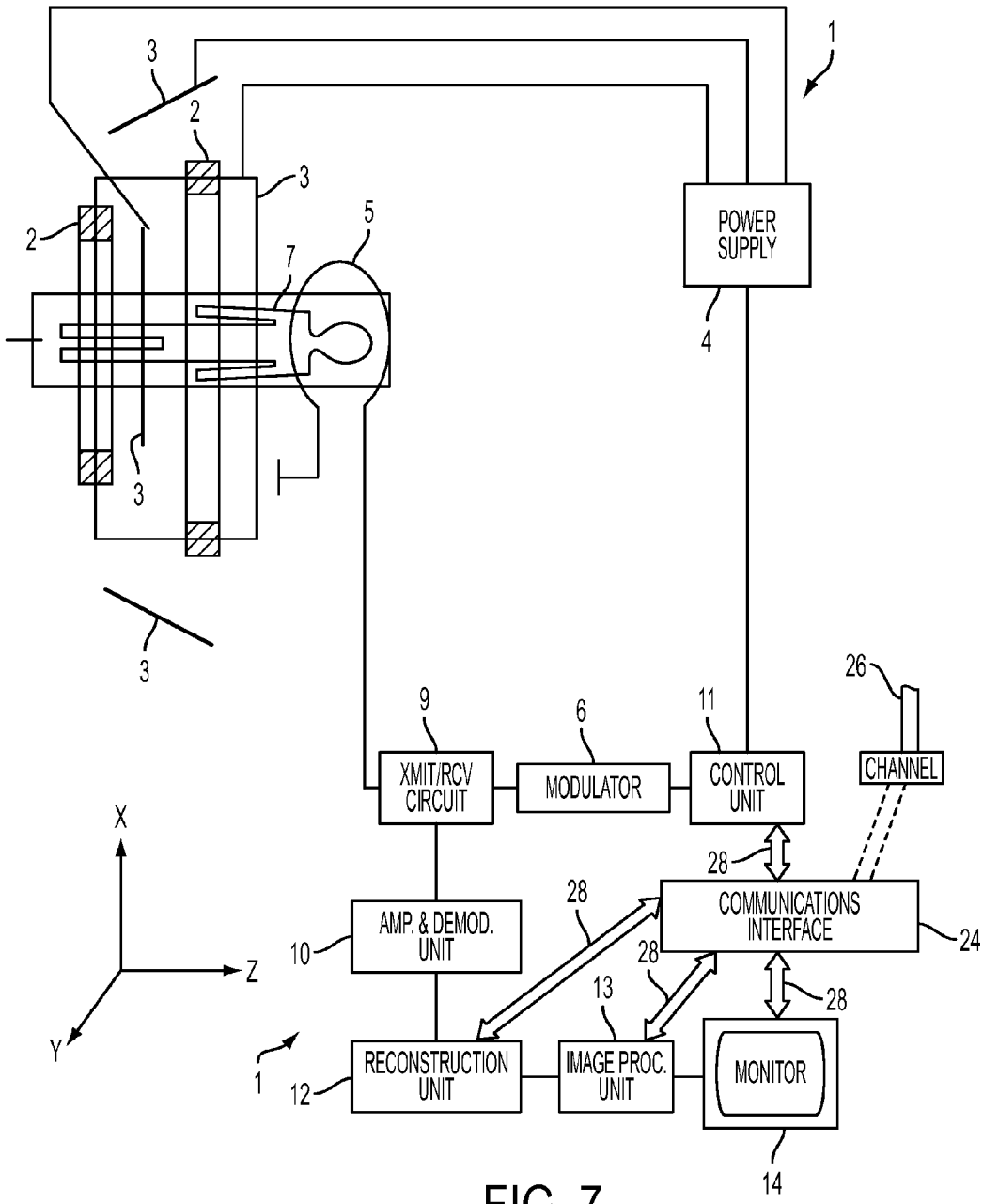
FIG. 7 illustrates a simplified exemplary embodiment of a MRI apparatus for practicing the present invention. The present invention method can be applied to various commercially available MRI apparatuses.

FIG. 7 illustrates a simplified schematic of a MR apparatus 1 for practicing the present invention. The MR apparatus 1 includes a main magnet system 2 for generating a steady magnetic field in an examination zone(s) of the MR apparatus. The z-direction of the coordinate system illustrated corresponds to the direction of the steady magnetic field generated by the magnet system 2.

The MR apparatus also includes a gradient magnet system 3 for generating temporary magnetic fields $G_x$, $G_y$ and $G_z$ directed in the z-direction but having gradients in the x, y or z directions, respectively. With this magnetic gradient system, magnetic-field gradients can also be generated that do not have directions coinciding with the main directions of the above coordinate system, but that can be inclined thereto, as is known in the art. Accordingly, the present invention is not limited to directions fixed with respect to the MR apparatus. In this application, for ease of description, the directions x, y and z (and the gradients along these directions) are used for the read direction, the phase-encode direction and slice-selection direction (or second phase-encode direction for 3D imaging), respectively.

Also, while traditional commercial methods provide linear gradients in the x, y, or z directions it is also possible not to utilize all three of these linear gradients. For example, rather than using a linear z gradient, one skilled in the art can use a z-squared dependence or some other spatial dependence to provide desired results.

The magnet systems 2 and 3 enclose an examination zone (s) which is large enough to accommodate a part of an object 7 to be examined, for example a part of a human patient. A power supply means 4 feed the gradient magnet system 3.

The MR apparatus also includes an RF transmitter system including RF transmitter coil 5, which generates RF pulses in the examination zone and is connected via transmitter/receiver circuit 9 to a RF source and modulator 6. The RF transmitter coil 5 is arranged around the part of body 7 in the examination zone. The MR apparatus also comprises an RF receiver system including an RF receiver coil which is connected via transmitter/receiver circuit 9 to signal amplification and demodulation unit 10. The receiver coil and the RF transmitter coil 5 may be one and the same coil. The MR apparatus also includes an amplification and demodulation unit 10, which, after excitation of nuclear spins in a part of the body placed within the examination space by RF pulses, after encoding by the magnetic-field gradients and after reception of the resulting MR signals by the receiver coil, derives sampled phases and amplitudes from the received MR signals. An image reconstruction unit 12 processes the received MR imaging signals to, inter alia, reconstruct an image by methods well-known in the art, such as by Fourier transformation. It should be appreciated by one skilled in the art that various reconstruction methods may be employed besides the Fourier Transform (FT) depending on factors such as the type of signal being analyzed, the available processing capability, etc. For example, but not limited thereto, the present invention may employ Short-Time FT (STFT), Discrete Cosine Transforms (DCT), or wavelet transforms (WT). By means of an image processing unit 13, the reconstructed image is displayed, for example, on monitor 14. Further, the image reconstruction unit can optionally process MR navigator signals to determine the displacement of a portion of the patient.

The MR apparatus also includes a control unit 11 that generates signals for controlling the RF transmitter and receiver systems by means of a modulator 6, the gradient magnetic field system by means of the power supply means 4, an image reconstruction unit 12 and an image processing unit 13. In a preferred embodiment, the control unit 11 (and other control elements in the MR apparatus) are implemented with *non-transitory* programmable elements, such as one or more programmable signal processors or microprocessors, communicating over busses with supporting RAM, ROM, EPROM, EEPROM, analog signal interfaces, control interfaces, interface to *non-transitory* computer-readable media and so forth. These programmable elements are commanded by software or firmware modules loaded into RAM, EPROM, EEPROM or ROM, written according to well-known methods to perform the real-time processing required herein, and loaded from *non-transitory* computer-readable media (or *non-transitory* computer useable medium), such as magnetic disks or tapes, or optical disks, or network interconnections, removable storage drives, or so forth. The present invention may be implemented using hardware, software or a combination thereof and may be implemented in one or more *non-transitory* computer systems or processing systems, such as personal digit assistants (PDAs), for various applications, e.g., remote care and portable care practices.

In a less preferred embodiment, the control unit that directs a MR apparatus for practicing the present invention can be implemented with dedicated electronic components in fixed circuit arrangements. In this case, these dedicated components are arranged to carry out the method described above. For example, the invention is implemented primarily in hardware using, for example, hardware components such as application specific integrated circuits(ASICs). Implementation of the hardware state machine to perform the functions described herein will be apparent to persons skilled in the relevant art(s).

In particular, the control unit commanded by its loaded software causes the generation of MR signals by controlling the application of MR pulse sequences, which comprise RF-pulses, time delays and temporary magnetic-field gradient pulses. These pulse sequences are generated according to the methods of the present invention as subsequently described, and generally include 2D and 3D imaging pulse sequences and optionally navigator pulse sequences for determining the displacement of the patient or material.

Furthermore, according to alternate embodiments of the present invention, the MR apparatus also optionally includes various other units (not illustrated) from which the state of motion of the part of the patient being imaged can be measured. These can include sensors directly indicating the instantaneous state of motion of the part of the patient being imaged, such as a chest belt for directly indicating chest displacement during respiration, or MR-active micro-coils whose position can be tracked, or optical means, or ultrasound means, or so forth. These units can also include sensors indirectly indicating the instantaneous state of motion of the part of the patient being imaged. For example, electrocardiogram and peripheral pulse sensors measure the temporal progress of the cardiac cycle, and permit inference of the actual state of motion of the heart from knowledge of cardiac displacements associated with each phase of the cardiac cycle. When these sensors are present to measure the state of motion, the control unit need not generate navigator pulse sequences.

Moreover, the control unit 11 may also include a communications interface 24. The communications interface 24 allows software and data to be transferred between and among, via communication path (i.e. channel) 28, the control unit 11, reconstruction unit 12, image processing unit 13, and monitor 14 and external devices. Examples of the communications interface 24 may include a modem, a network interface (such as an Ethernet card), a communications port, a PCMCIA slot and card, etc. Software and data transferred via communications interface 24 are in the form of signals which may be electronic, electromagnetic, optical or other signals capable of being received by communications interface 24. The signals are provided to communications interface 24 via the communications path (i.e., channel) 26. The channel 26 carries signals and may be implemented using wire or cable, fiber optics, a phone line, a cellular phone link, a RF link, IR link and other communications channels.

The preferred embodiments of the present invention may be implemented as *non-transitory* software/firmware/hardware with various MR apparatuses, and methods, as one skilled in the art would appreciate. Other exemplary apparatuses and methods, but not limited thereto, are disclosed in the following U.S. patents, of which are hereby incorporated by reference in their entirety herein: U.S. Pat. No. 6,230,039 B1—Staber et. al.; U.S. Pat. No. 5,749,834—Hushek; and U.S. Pat. No. 5,656,776—Kanazawa.

The Methods of the Present Invention

Figure 1:
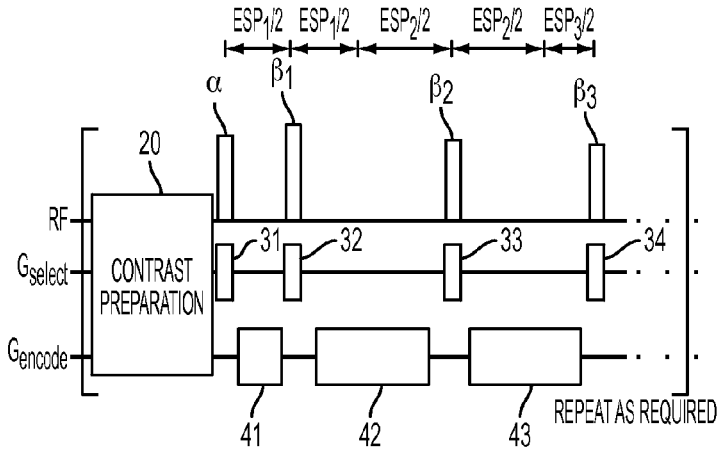
FIG. 1 is a schematic representation of a general spin-echo-train MRI pulse sequence. This is an exemplary type of MRI pulse sequence to which the invention applies. The present invention method can be applied to various types of pulse sequences.

Turning now to FIG. 1, pertaining to the general methods of this invention, first in a preferred embodiment, the present invention applies to magnetic resonance imaging MRI) using a "spin-echo-train" MRI pulse sequence, which is a pulse sequence that generates more than one spin echo for each desired image contrast following each excitation RF pulse. Any form of the applied spatial-encoding gradient waveforms, variations in the spacing between refocusing RF pulses, and/or any combination of non-selective, spatially-selective, and spectrally-selective RF pulses are applicable to the present invention methods as long as their effects on the magnetization are appropriately considered in the derivation of the variable-flip-angle series. A contrast preparation phase, such as an inversion RF pulse followed by a time delay, may precede the acquisition phase of the pulse sequence.

Still referring to FIG. 1, there is shown a schematic representation of a general spin-echo-train MRI pulse sequence. This is an exemplary type of MRI pulse sequence to which the invention applies. The representation is of a general spin-echo-train MRI pulse sequence showing the excitation RF pulse ($\alpha$) and the first three ($\beta_1$, $\beta_2$, $\beta_3$) of n refocusing RF pulses, where n>1. The RF pulse waveforms are drawn as rectangular for simplicity, but they may be amplitude and/or phase modulated as appropriate for the desired application. The echo spacing (ESP) may be fixed or may vary between echoes. The contrast preparation module 20 denotes the optional use of additional RF pulses, gradient pulses and/or time delays (e.g., an inversion pulse followed by a time delay) to permit additional control over the image contrast. The boxes on the $G_{select}$ axis, referenced as 31, 32, 33 and 34, symbolically denote the optional use of magnetic-field gradient waveforms for spatial and/or spatial-spectral selection. The boxes on the $G_{encode}$ axis, referenced as 41, 42, and 43, symbolically denote the magnetic-field gradient waveforms used for spatial encoding. The contrast preparation (if any) and the echo train are repeated as necessary to collect the desired k-space data. The timing parameters and the number of echoes may vary between repetitions.

For a spin-echo-train pulse sequence, an object of the present invention is to derive a series of refocusing RF pulses with variable flip angles, and, optionally, variable phase angles, that yields a specifically prescribed signal evolution during the echo train for selected T1 and T2 relaxation times. To achieve this, a mathematical model of the pulse sequence, incorporating the specific timing, gradient and RF parameters of choice, is used to calculate the signal evolution during the echo train. This model would typically be implemented in the form of a *non-transitory* computer program that is based on the established mathematical equations that describe the behavior of the magnetization during a pulse sequence. See Haacke E. M., Brown R. W., Thompson M. R., Venkatesan R., "Magnetic Resonance Imaging: Physical Principles and Sequence Design", John Wiley & Sons, New York, 1999, of which is hereby incorporated by reference in its entirety. Other exemplary spin-echo-train MR imaging methods are disclosed in the following U.S. patents, of which are hereby incorporated by reference in their entirety herein: U.S. Pat. No. 5,680,045—Feinberg; U.S. Pat. No. 5,612,619—Feinberg; U.S. Pat. No. 5,541,511—Henning; U.S. Pat. No. 5,315,249—Le Roux et al.; U.S. Pat. No. 5,270,654—Feinberg et al.; U.S. Pat. No. 4,901,020—Ladebeck et al. and U.S. Pat. No. 4,818,940—Henning et al.

Given such a computer-based calculation tool, the process for deriving this flip-angle series can be generally summarized in the following four steps (steps I-IV) briefly discussed below. Firstly, STEP I, the pulse sequence timing parameters (e.g., repetition time, echo spacing(s), other time delays), the pulse sequence magnetic-field gradient configuration, the desired shape of the prescribed signal evolution during the echo train, the T1 and T2 relaxation parameters and the proton density for the "target" tissue, and a target signal intensity are chosen. The signal evolution may assume any physically-realizable shape. Some examples, but not limited thereto, include: a constant; a linear decay; an exponential decay; a linear or exponential decay for the initial portion and a constant for the remainder; and a linear or exponential decay for the initial portion, a constant for the second portion and a linear or exponential decay for the remainder. The T1, T2 and proton density for the target tissue may equal those for a specific biological tissue (e.g., brain gray matter) or material, or they may be arbitrarily chosen. The target signal intensity is the desired signal intensity corresponding to a specific echo in the echo train (e.g., the first or the middle echo).

Secondly, STEP II, the flip angle $\beta_i$ (see FIG. 1) which yields the desired signal intensity for the $i^{th}$ echo interval is determined, where i ranges from 1 to the number of refocusing RF pulses in the echo train. This flip angle can be calculated using any appropriate method such as a "brute-force" search or interval bisection and interpolation. See Forsythe G. E., Malcolm M. A., Moler C. B., "Computer Methods for Mathematical Computations", Prentice-Hall, Englewood Cliffs, 1977, of which is hereby incorporated by reference in its entirety.

Thirdly, STEP III, the pulse number i is incremented and the second step is repeated until all flip angles for a given echo train are calculated. If, for any value of i, the desired signal intensity for the $i^{th}$ echo interval cannot be achieved, the target signal intensity is reduced and the calculation process is restarted.

Fourthly, STEP IV, if the pulse sequence under consideration requires more than one repetition of the echo train to acquire the desired k-space data, the second and third steps are repeated as necessary until a steady state of the magnetization is reached.

After a given series of variable flip angles are derived, the target signal intensity can be incremented until the maximum value for which the prescribed signal-evolution shape can be realized is reached, thus allowing determination of the maximum signal and/or contrast values that can be obtained for a specific pulse sequence configuration and signal evolution.

Next, exemplary *non-transitory* hardware, firmware and software implementations of the methods of the present invention are discussed.

Figure 8:
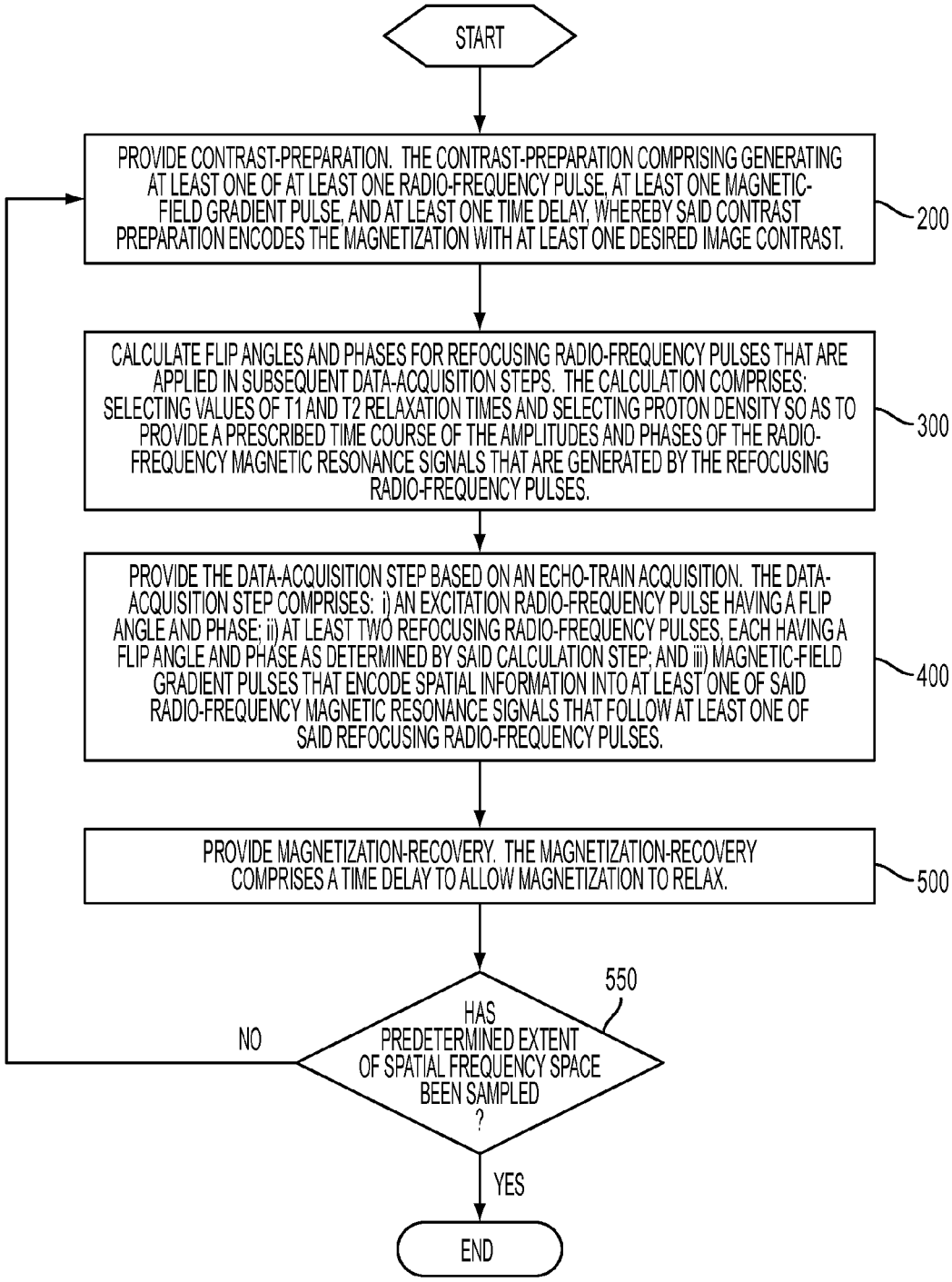
FIG. 8 is an exemplary flowchart for a simplified preferred implementation of the methods of the present invention.

FIG. 8 illustrates a preferred method for practicing the invention as implemented by, for example, *non-transitory* software loaded into the control unit of the MR apparatus. Once the process starts and initializes, at step 200, the contrast-preparation is provided by generating at least one of a RF pulse, magnetic-field gradient pulse, and/or time delay.

The contrast-preparation encodes the magnetization with at least one desired image contrast.

During step 300, flip angles and phases are calculated for refocusing RF pulses that are applied in subsequent data-acquisition steps so as to yield—for selected values of T1 and T2 relaxation times and proton density—a prescribed time course for the amplitudes and phases of the RF magnetic resonance signals that are generated by the refocusing RF pulses.

During step 400, data-acquisition is achieved based on an echo-train acquisition, comprising the following: i) an excitation RF pulse having a flip angle and phase; ii) at least two refocusing RF pulses, each having a flip angle and phase as determined by the calculation step; and iii) magnetic-field gradient pulses that encode spatial information into at least one of the RF magnetic resonance signals that follow at least one of the at least two refocusing RF pulses.

Also, in step 500, magnetization-recovery is provided whereby the magnetization-recovery comprises a time delay to allow magnetization to relax. Finally, as illustrated by step 550, the aforementioned method is repeated until a predetermined extent of spatial-frequency space has been sampled.

It is important to appreciate that the various steps discussed herein need not be performed in the illustrated order, and in fact it may be preferred to perform the steps, at least in part, simultaneously or omit some of the illustrated steps, at least in part.

Figure 9A:
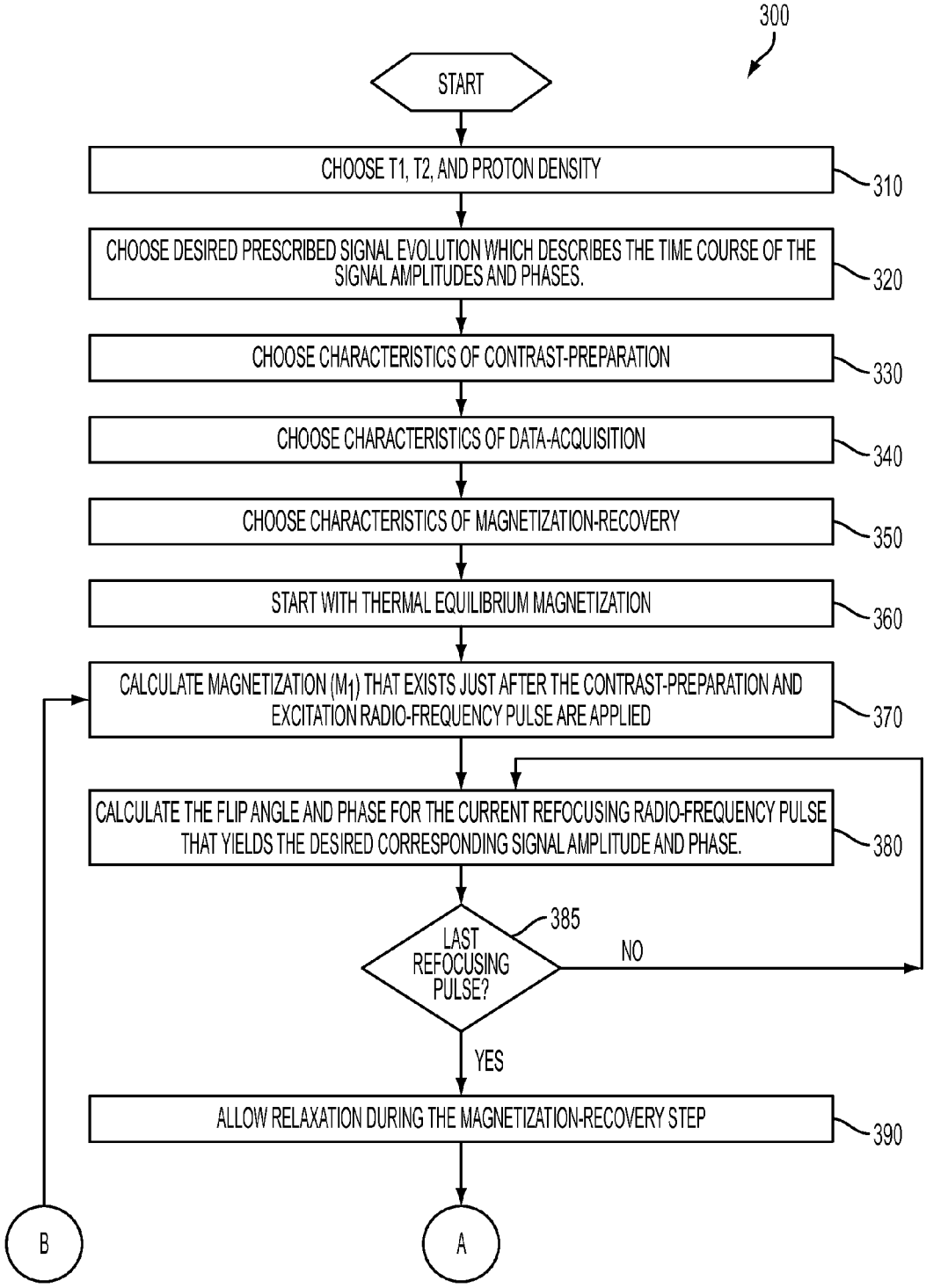
FIGS. 9A-9B is an exemplary flowchart for a simplified preferred implementation of the calculation methods of the present invention, step 200.
Figure 9B:
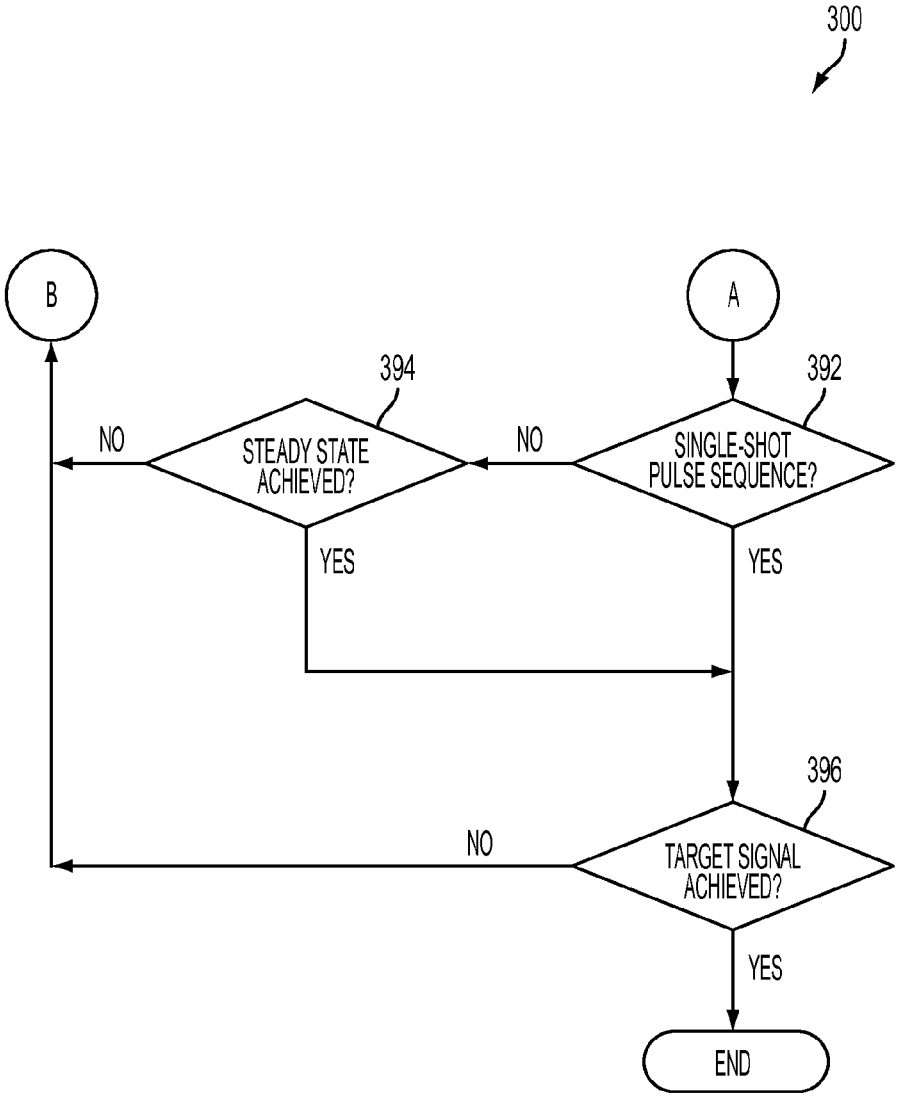

Next, turning to FIGS. 9A-9B, an exemplary method for the calculating step 300 is provided. In step 310, T1, T2, and proton density are chosen, and in step 320, a desired prescribed signal evolution which describes the time course of the signal amplitudes and phases, is also chosen. Turning to steps 330 and 340, the characteristics of the contrast-preparation and data-acquisition, respectively, are chosen (additional details shall be discussed with FIGS. 10-11). Provided in step 350, the characteristics of the magnetization-recovery period are chosen. Accordingly, at step 360, the process of calculating the individual flip angles starts and is initialized with thermal equilibrium magnetization. At step 370, the magnetization, $M_1$, is calculated that exists immediately after the contrast-preparation and excitation RF pulse are applied. At step 380, starting with $M_1$ which is the input magnetization for the first refocusing RF pulse, the flip angle and phase are calculated for the current refocusing RF pulse that yields the desired corresponding signal amplitude and phase, and this process is repeated until the last refocusing RF pulse is achieved, step 385. If the last pulse is achieved, then step 390 permits relaxation during the magnetization-recovery period. In steps 392 and 394, the process checks for a single-shot pulse sequence method and whether steady state has been achieved. This accounts for the effects of multiple applications of the contrast-preparation, data-acquisition and magnetization-recovery steps if required to sample the desired extent of spatial-frequency space. As used herein, the "steady state" of magnetization is a state created by certain fast (with repeat times short compared to relaxation times) imaging pulse sequences during which both the longitudinal and the transverse components of the nuclear magnetization exhibit a steady temporal state. Once steady state is satisfied the process checks whether the target signal has been achieved, step 396, so as to increment across the overall signal level.

Figure 10:
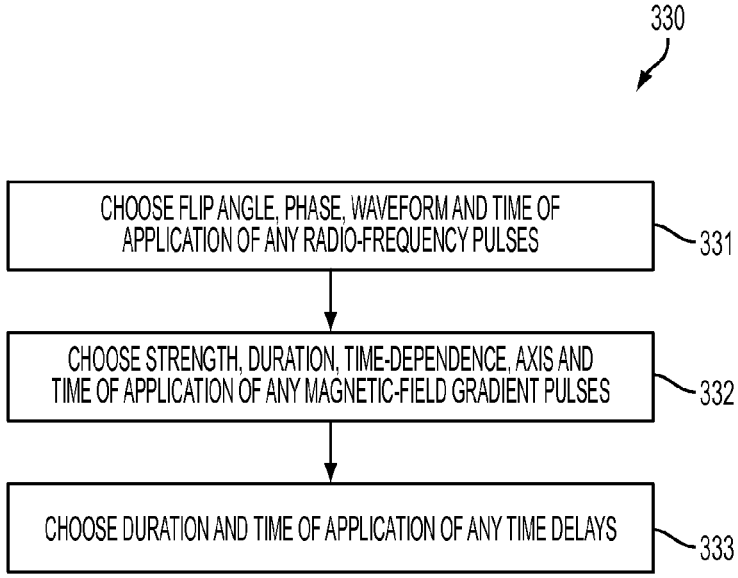
FIG. 10 is an exemplary flowchart for a simplified preferred implementation of the contrast-preparation methods of the present invention.

Turning to the exemplary contrast-preparation process as shown in FIG. 10, at step 331, the following are chosen: flip angle, phase, waveform and the time of application of any RF pulses. In step 332, the following are chosen: strength, duration, time-dependence, axis and time of application of any magnetic-field gradient pulses. Moreover, in step 333, the following are chosen: duration and time of application of any time delays.

Figure 11:
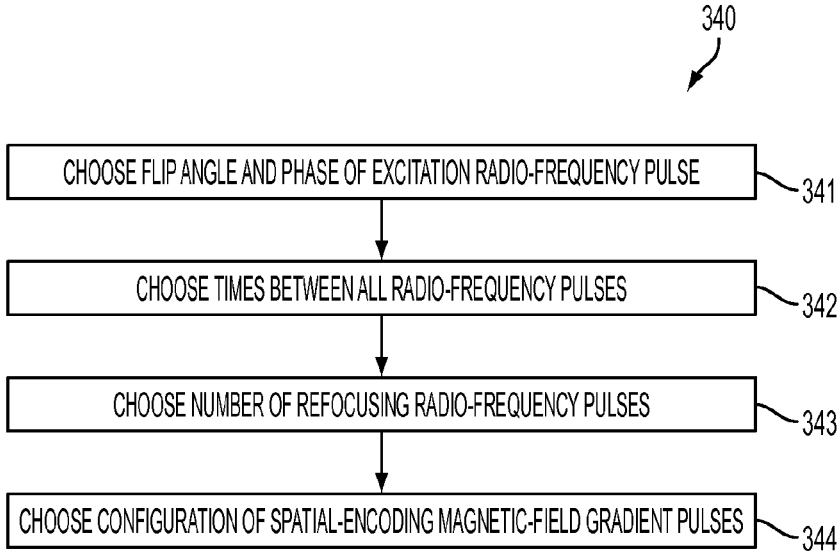
FIG. 11 is an exemplary flowchart for a simplified preferred implementation of the data-acquisition methods of the present invention.

Turning to the exemplary data-acquisition process as shown in FIG. 11, at step 341, the following are chosen: the flip angle and phase of the excitation RF pulse. Also, at steps 342, 343, and 344, the times between all RF pulses; number of refocusing RF pulses; and configuration of spatial-encoding magnetic-field gradient pulses are chosen, respectively.

EXAMPLES

Specific implementations of the present invention methodology are useful to illustrate its nature. These examples are non-limiting and are offered as exemplary only. For this purpose, set forth herein are experimental studies in which the present invention method was used to generate variable-flip-angle series for three-dimensional (3D) T2-weighted MR imaging of the human brain and cervical spine using a "turbo-SE" type (i.e., RARE-as set forth in Henning et al., Magn. Res. Med. 1986, 3:823-833) spin-echo-train pulse sequence, of which is hereby incorporated by reference in its entirety. Brain studies were performed at 1.5 Tesla and 3 Tesla; spine studies were performed at 1.5 Tesla. MR images were obtained using a 1.5-Tesla commercial whole-body imager (MAGNETOM SYMPHONY, Siemens Medical Systems, Iselin, N.J.) or a 3-Tesla commercial whole-body imager (MAGNETOM ALLEGRA, Siemens Medical Systems, Iselin, N.J.). The standard head RF coil supplied with the imager was used. Informed consent was obtained from all subjects prior to imaging.

Figure 3:
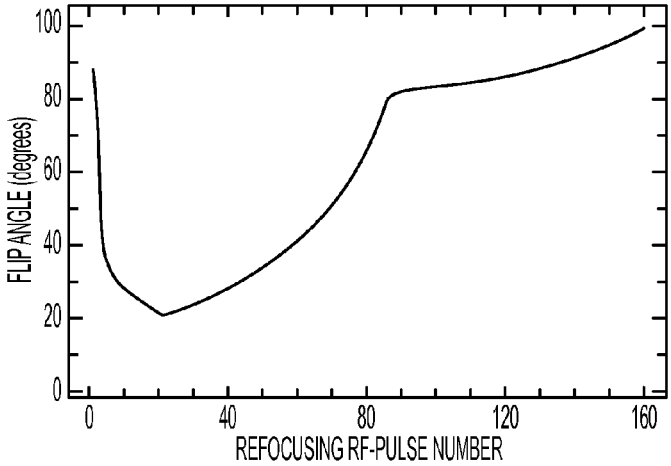
FIG. 3 shows the variable-flip-angle series corresponding to FIG. 2 that was derived using the present invention methods as described herein.

Turning to FIGS. 2-3, FIG. 2 *provides a graph of normalized signal amplitude versus echo number* (*total number of echoes for signal evolution=160*) *that* shows an example of a prescribed signal evolution for gray matter that can be used to generate T2-weighted MR images of the brain. The evolution consists of the following: exponential decay during the first 20 echoes with decay constant of 114 ms, constant for 66 echoes, and exponential decay during the remaining echoes with decay constant of 189 ms. FIG. 3 shows the corresponding variable-flip-angle series that was derived using the present invention methods as described herein. Using an interactive computer-based (Ultra-60 workstation; Sun Microsystems, Inc.) theoretical model, and the prescribed signal evolution for brain gray matter, at 1.5 Tesla (see FIG. 2), the four-step process described above was used to derive the corresponding variable-flip-angle series depicted in FIG. 3. The pulse-sequence parameters included an echo train length of 160, an echo spacing of 4.1 ms (fixed), a total echo-train duration of 656 ms (*i.e., on the order of 600 ms*), a repetition time of 2750 ms and an effective echo time (*i.e., the time period from the excitation RF pulse to the collection of data corresponding to substantially zero-spatial frequency* (*the center of k space*) of 328 ms (*i.e., on the order of 300 ms*).

Example No. 1

Figure 4A:
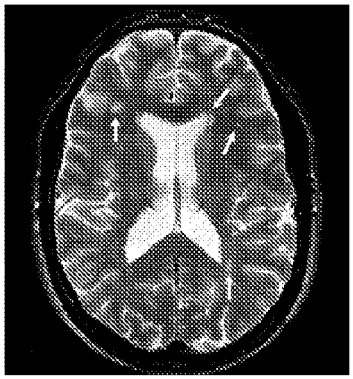
Figure 4B:
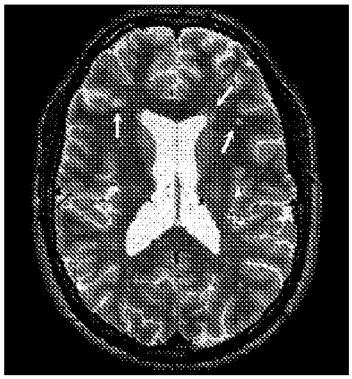
Figure 4C:
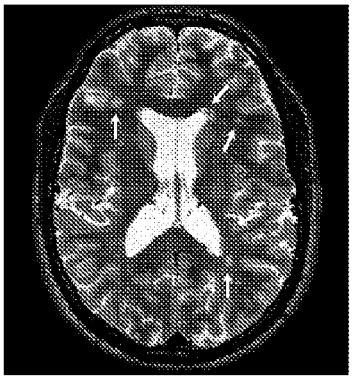
Figure 4D:
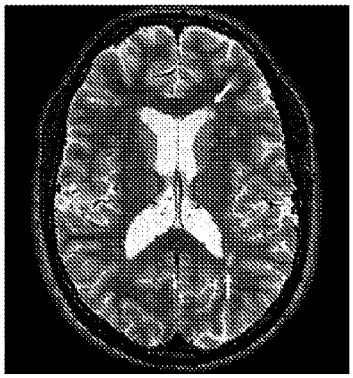

FIGS. 4B-4F show an example of MR brain images obtained at 1.5 Tesla using the variable-flip-angle series of FIG. 3 in a "turbo-SE" type spin-echo-train pulse sequence; collectively. In particular, the T2-weighted two-dimensional and three-dimensional SE images of FIGS. 4(A) and 4(B)-4(C), respectively, were obtained from a 59 year old volunteer for demonstrating age-related non-specific white-matter lesions. As can be observed, arrows mark several of these lesions. The adjacent 1-mm thick 3D images, as shown in FIGS. 4B-4D, correspond to the single 3-mm thick 2D image in FIG. 4A. In the 3D images, the phase-encoding direction corresponding to the 160-echo train is left-to-right in FIGS. 4B-4D and 4F. No image artifacts secondary to this very long spin-echo train are apparent. Pulse sequence parameters for the 10 minute 3D acquisition included the following: repetition time/effective echo time, 2750/328 ms; matrix, 256×160×216; field of view, 25.6×16.0×21.6 cm; voxel size, 1.0×1.0×1.0 mm; echo spacing, 4.1 ms; echo train length, 160; and full-Fourier acquisition. Pulse sequence parameters for the 14.8 minute 2D acquisition included the following: repetition time/first echo time/second echo time, 2750/20/80 ms; matrix, 256×160; field of view, 25.6×16.0 cm; section thickness, 3.0 mm; number of sections, 54; full-Fourier acquisition; first-order flow compensation; and reduced bandwidth on second echo.

In summary, using the variable-flip-angle series of FIG. 3, the T2-weighted 3D images were obtained at 1.5 Tesla from the brain of a healthy volunteer, and were compared to images from a 2D conventional-SE pulse sequence (see FIG. [4] *4A*). The images in [FIG. 4] *FIGS. 4B-4F* exhibit two important features: (1) the very long spin-echo-train images (FIGS. 4B-4F) display high contrast between the age-related lesions in the brain of this volunteer and surrounding normal appearing white matter, indicating that this echo train shall provide clinically useful contrast characteristics that appear very similar to those for conventional T2-weighed SE images (FIG. 4A); and (2) the thin 1-mm sections provide an improved definition of lesion location and extent; the lesions seen in the 2D image appear, to varying degrees, in three adjacent 1-mm sections. Furthermore, the overall image quality for the very long spin-echo-train and conventional-SE images is similar, despite the much thinner sections of the former.

Figure 4E:
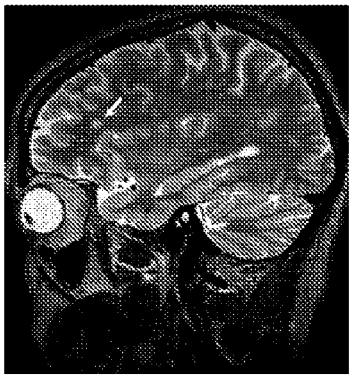
Figure 4F:
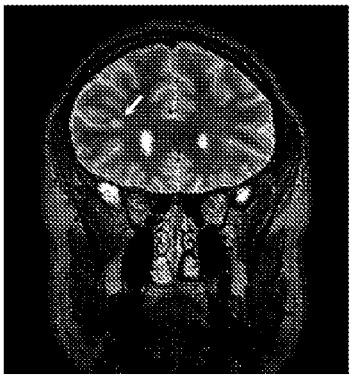

Finally, referring to FIGS. 4E-4F, such figures depict the largest lesion in sagittal and coronal orientations, respectively, this demonstrates the capability of the 3D acquisition to provide high-quality images in arbitrary orientations.

Example No. 2

Figure 5A:
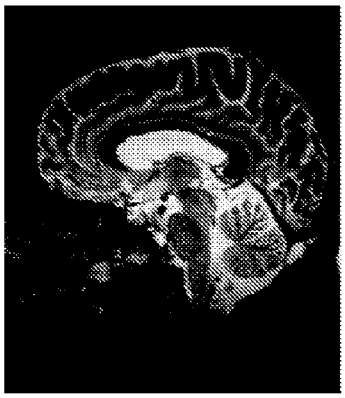
FIGS. 5(A)-5(C) show T2-weighted sagittal, coronal, and axial images, respectively, reconstructed from the same three-dimensional acquisition. Finally.
Figure 5B:
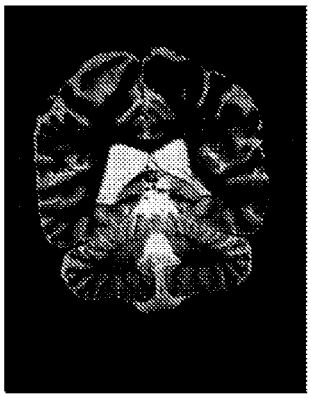
Figure 5C:
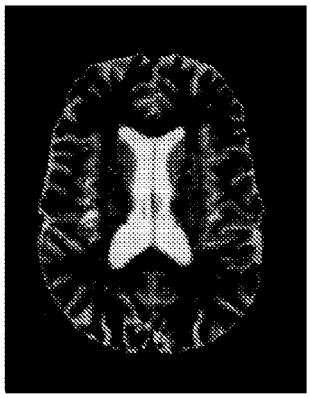

Next, referring to FIGS. 5A-5C, using the same pulse-sequence parameters as described above in FIGS. [2-4] *2-4F*, T2-weighted images were also obtained at 3 Tesla from the brain of a healthy volunteer. The three 1-mm thick images were all reconstructed from the same 3D acquisition. These images appeared similar to those obtained at 1.5 Tesla, but exhibited higher signal-to-noise ratios. Of particular importance, the partial-body and local values for the specific absorption rate (SAR) were 1.29 W/kg and 3.16 W/kg, respectively, compared to the FDA limits for partial-body and local SAR of 3.0 and 8.0 W/kg, respectively. The SAR values at 3 Tesla were much less than the FDA limits, indicating that there remains substantial latitude in the pulse-sequence design from the perspective of power deposition, including the possibility for even more refocusing RF pulses per excitation. Thus, according to the present invention, although the use of spin-echo-train methods has been restricted at high fields, such as 3 Tesla, due to power deposition limits, very long spin-echo trains based on prescribed signal evolutions permit high-quality brain images to be acquired at 3 Tesla with power deposition well below the FDA limits.

Example No. 3

Figure 6:
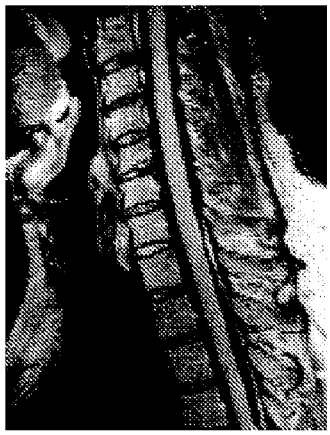
FIG. 6 shows a sagittal image of the cervical spinal cord obtained at 1.5 Tesla.

Referring to FIG. 6, as the final example, FIG. 6 shows a T2-weighted sagittal image of the cervical spinal cord obtained at 1.5 Tesla from a healthy volunteer, again using a 160-echo train. The quality of cervical-spine images from T2-weighted MRI techniques is often compromised by artifacts arising from the pulsatile motion of the CSF surrounding the cord. One potential solution to this problem is to use FLAIR imaging. See Hajnal et al. While this technique can completely suppress the signal from CSF, there remains some concern about its ability to depict the full range of clinically-relevant lesions. See Hittmair et al. and Keiper et al. As illustrated in FIG. 6, an alternative is to use a T2-weighted technique with a very long spin-echo train based on a prescribed signal evolution, as provided by the present invention. The signal from CSF is uniformly suppressed without generating motion artifacts. The combination of the long echo train and the relatively low flip angles of the refocusing RF pulses results in suppression of even slowly moving fluid. The "dark-CSF" image in FIG. 6 differs from a FLAIR image, among other things, in an important way. With FLAIR, the CSF is suppressed based on its long TI. Hence, the signals from any other tissues with relatively long T1s will be diminished. This is one potential explanation for the problems in depicting certain lesions with FLAIR—these lesions may have long T1 components. In contrast, turning to the present invention, the CSF suppressed in FIG. 6 is solely due to its motion; long T1 lesions in the cord will be unaffected.

An advantage of the present invention is that it provides a method, apparatus, and *non-transitory* computer useable medium (readable media) to extend the usable duration of the echo train in magnetic resonance imaging pulse sequences such as RARE, turbo-spin-echo, fast-spin-echo or GRASE, substantially beyond that obtainable with conventional methods. This increase in the echo-train duration can be used to decrease the image acquisition time and/or increase the spatial resolution. The power deposition achieved with this technique is much less than that for conventional spin-echo-train pulse sequences, and thus the invention shall be especially useful, among other things, for human imaging applications at high magnetic field strengths.

Another advantage of the present invention is that it improves the imaging of various objects and zones, including the brain. The present invention is also applicable to other regions of the body such as the spinal cord or joints. In particular, the present invention enables high-resolution 3D imaging of the brain with clinically-reasonable acquisition times, which is useful for quantitative imaging of disseminated diseases such as multiple sclerosis. For these diseases, high-resolution 3D imaging provides a valuable tool for monitoring disease progression and response to therapy during treatment or drug trials. The present invention is also useful for non-human applications of magnetic resonance, such as imaging of materials (e.g., plants or food products) or animal models of disease at high field.

Further yet, an advantage of the present invention is that it provides a means to shorten image acquisition times and/or increase spatial resolution for widely-used spin-echo-train magnetic resonance imaging techniques. Such improvements will in turn make it feasible to obtain images with certain valuable combinations of resolution and image contrast which have not been practical heretofore. In addition, the present invention permits spin-echo-train methods to be used for high-field imaging that would not otherwise meet the safety guidelines established by the Food and Drug Administration for power deposition in human MRI.

Finally, another advantage of the present invention method and apparatus is that it explicitly considers the T1 and T2 relaxation times for the tissues of interest and thereby permits the desired image contrast to be incorporated into the tissue signal evolutions corresponding to the long echo train. Given the considerable role that spin-echo-train methods already play in MR imaging, the present invention methodology will be of significant importance.

All US patents and US patent applications cited herein are incorporated herein by reference in their entirety and for all purposes to the same extent as if each individual patent or patent application was specifically and individually indicated to be incorporated by reference in its entirety for all purposes.

The invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims rather than by the foregoing description, and all changes which come within the meaning and range of equivalency of the claims are therefore intended to be embraced herein.

We claim:

1. A method for generating a spin echo pulse sequence for operating a magnetic resonance imaging apparatus for imaging an object [that permits at least one of lengthening usable echo-train duration, reducing power deposition and incorporating desired image contrast into the tissue signal evolutions], said method comprising:

a) providing contrast-preparation, said contrast-preparation comprising generating at least one of at least one radio-frequency pulse, at least one magnetic-field gradient pulse, and at least one time delay, whereby said contrast preparation encodes the magnetization with at least one desired image contrast;

b) calculating flip angles and phases of refocusing radio-frequency pulses that are applied in a data-acquisition step, wherein said calculation provides desired prescribed signal evolution and desired overall signal level *that permit, during said data-acquisition step, at least one of lengthening usable echo-train duration, reducing power deposition and incorporating desired image contrast into the tissue signal evolutions*, said calculation comprises:

i) selecting values of T1 and T2 relaxation times and selecting proton density;

ii) selecting a prescribed time course of the amplitudes and phases of the radio-frequency magnetic resonance signals that are generated by said refocusing radio-frequency pulses; and iii) selecting characteristics of said contrast-preparation step, said data-acquisition step and a magnetization-recovery step, with the exception of the flip angles and phases of the refocusing radio-frequency pulses that are to be calculated; and c) providing said-data acquisition step based on a spin echo train acquisition, said data-acquisition step comprises:

i) an excitation radio-frequency pulse having a flip angle and phase;

ii) at least two refocusing radio-frequency pulses, each having a flip angle and phase as determined by said calculation step; and iii) magnetic-field gradient pulses that encode spatial information into at least one of said radio-frequency magnetic resonance signals that follow at least one of said refocusing radio-frequency pulses;

d) providing magnetization-recovery, said magnetization-recovery comprises a time delay to allow magnetization to relax; and e) repeating steps (a) through (d) until a predetermined extent of spatial frequency space has been sampled.

2. The method of claim 1, wherein said calculation of the flip angles and phases is generated using an appropriate analytical or computer-based algorithm.

3. The method of claim 1, wherein said calculation of the flip angles and phases is generated to account for[,] the effects of multiple applications of[:] said contrast-preparation, said data-acquisition and said magnetization-recovery steps, which are required to sample the desired extent of spatial-frequency space.

4. The method of claim 1, wherein a two-dimensional plane of spatial-frequency space is sampled.

5. The method of claim 1, wherein a three-dimensional volume of spatial-frequency space is sampled.

[6. The method of claim 1, wherein at least one of said contrast-preparation and magnetization-recovery steps is omitted.]

7. The method of claim 1, wherein said calculation step is performed once before one of said first contrast-preparation step and said first data-acquisition step.

8. The method of claim 1, wherein at least one of at least one said contrast-preparation step, at least one said data-acquisition step and at least one said magnetization-recovery step is initiated by a trigger signal to [synchronizes] *synchronize* the pulse sequence with at least one of at least one external temporal event and at least one internal temporal event.

9. The method of claim 8, wherein said external and internal events comprise at least one of at least one voluntary action, at least one involuntary action, at least one respiratory cycle and at least one cardiac cycle.

10. The method of claim 1, wherein at least one of at least one radio-frequency pulse and at least one magnetic-field gradient pulse is applied as part of at least one of at least one said magnetization-preparation step and at least one said data-acquisition step is for the purpose of stabilizing the response of at least one of magnetization related system and said apparatus related hardware system.

11. The method of claim 1, wherein time duration varies between repetitions for at least one of at least one said contrast-preparation step, at least one said data-acquisition step and at least one said magnetization-recovery step.

12. The method of claim 1, wherein the time periods between consecutive refocusing radio-frequency pulses applied during said data-acquisition steps are all of equal duration.

13. The method of claim 1, wherein time periods between consecutive refocusing radio-frequency pulses applied during said data-acquisition steps vary in duration amongst pairs of refocusing radio-frequency pulses during at least one said data-acquisition step.

14. The method of claim 1 wherein all the radio-frequency pulses are at least one of non-spatially selective and non-chemically selective.

15. The method of claim 1, wherein at least one of the radio-frequency pulses is at least one of spatially selective in one of one, two and three dimensions, chemically selective, and adiabatic.

16. The method of claim 1, wherein during each said data-acquisition step, the phase difference between the phase for the excitation radio-frequency pulse and the phases for all refocusing radio-frequency pulses is [about] *substantially* 90 degrees.

17. The method of claim 1, wherein during each data-acquisition step, the phase difference between the phase for any refocusing radio-frequency pulse and the phase for the immediately subsequent refocusing radio-frequency pulses is [about] *substantially* 180 degrees, and the phase difference between the phase for the excitation radio-frequency pulse and the phase for the first refocusing pulse is one of [about] *substantially* 0 degrees and [about] *substantially* 180 degrees.

18. The method of claim 17, wherein the flip angle for the excitation radio-frequency pulse is [about] *substantially* one-half of the flip angle for the first refocusing radio-frequency pulse.

19. The method of claim 1, wherein the spatial-encoding magnetic-field gradient pulses applied during each said data-acquisition step are configured so as to collect data, following each of at least one of the refocusing radio-frequency pulses, for one line in spatial-frequency space which is parallel to all other lines of data so collected, so as to collect the data using a magnetic resonance imaging technique selected from the group consisting of rapid acquisition with relaxation enhancement (RARE), fast spin echo (FSE), and turbo spin echo (TSE or TurboSE).

20. The method of claim 1, wherein the spatial-encoding magnetic-field gradient pulses applied during each said data-acquisition step are configured so as to collect data, following each of at least one of the refocusing radio-frequency pulses, for two or more lines in spatial-frequency space which are parallel to all other lines of data so collected, so as to collect the data using a magnetic resonance imaging technique selected from the group consisting of gradient and spin echo (GRASE) and turbo gradient spin echo (TGSE or TurboGSE).

21. The method of claim 1, wherein the spatial-encoding magnetic-field gradient pulses applied during each said data-acquisition step are configured so as to collect data, following each of at least one of the refocusing radio-frequency pulses, for one or more lines in spatial-frequency space, each of which pass through one of a single point in spatial-frequency space and a single line in spatial-frequency space, so as to collect the data using a magnetic resonance imaging technique selected from the group consisting of radial sampling or projection-reconstruction sampling.

22. The method of claim 21, wherein the single point in spatial-frequency space is [about] *substantially* zero spatial frequency.

23. The method of claim 21, wherein the single line in spatial-frequency space includes zero spatial frequency.

24. The method of claim 1, wherein the spatial-encoding magnetic-field gradient pulses applied during each said data-acquisition step are configured so as to collect data, following each of at least one of the refocusing radio-frequency pulses, along a spiral trajectory in spatial-frequency space, each trajectory of which is contained in one of two dimensions and three dimensions, and each trajectory of which passes through one of a single point in spatial-frequency space and a single line in spatial-frequency space.

25. The method of claim 24, wherein the single point in spatial-frequency space is [about] *substantially* zero spatial frequency.

26. The method of claim 24, wherein the single line in spatial-frequency space includes zero spatial frequency.

27. The method of claim 1, wherein the spatial-encoding magnetic-field gradient pulses applied during at least one of said data-acquisition steps are configured to collect sufficient spatial-frequency data to reconstruct at least two image sets, each of which exhibits contrast properties different from the other image sets.

28. The method of claim 27, wherein at least some of the spatial-frequency data collected during at least one of said data-acquisition steps is used in the reconstruction of more than one image set, whereby the data is shared between image sets.

29. The method of claim 1, wherein the spatial-encoding magnetic-field gradient pulses applied during at least one of said data-acquisition steps are configured so that, for the echo following at least one of the refocusing radio-frequency pulses, at least one of the first moment, the second moment and the third moment corresponding to at least one of the spatial-encoding directions is approximately zero.

30. The method of claim 1, wherein the spatial-encoding magnetic-field gradient pulses applied during at least one of said data-acquisition steps are configured so that, following at least one of the refocusing radio-frequency pulses, the zeroth moment measured over the time period between said refocusing radio-frequency pulse and the immediately consecutive refocusing radio-frequency pulse is approximately zero for at least one of the spatial-encoding directions.

31. The method of claim 1, wherein during all said data-acquisition steps the duration of all data-sampling periods are equal.

32. The method of claim 1, wherein during at least one of said data-acquisition steps at least one of the data-sampling periods has a duration that differs from the duration of at least one other data-sampling period.

33. The method of claim 1, wherein the spatial-encoding magnetic-field gradient pulses applied during said data-acquisition steps are configured so that the extent of spatial-frequency space sampled along at least one of the spatial-encoding directions is not symmetric with respect to zero spatial frequency, whereby a larger extent of spatial-frequency space is sampled to one side of zero spatial frequency as compared to the opposite side of zero spatial frequency.

34. The method of claim 33 wherein said spatial-frequency data is reconstructed using a partial-Fourier reconstruction algorithm.

35. The method of claim 1, wherein during at least one of said data-acquisition steps the temporal order in which spatial-frequency space data is collected for at least one of the spatial-encoding directions is based on achieving at least one of selected contrast properties in the image and selected properties of the corresponding point spread function.

36. The method of claim 1, wherein during at least one of said data-acquisition steps the temporal order in which spatial-frequency space data is collected is different from that for at least one other data-acquisition step.

37. The method of claim 1, wherein during at least one of said data-acquisition steps the extent of spatial-frequency space data that is collected is different from that for at least one other data-acquisition step.

38. The method of claim 1, wherein during at least one of said data-acquisition steps spatial encoding of the radio-frequency magnetic resonance signal that follows at least one of the refocusing radio-frequency pulse is performed using only phase encoding so that said signal is received by the radio-frequency transceiver in the absence of any applied magnetic-field gradient pulses and hence contains chemical-shift information.

39. The method of claim 1, wherein at least one navigator radio-frequency pulse is incorporated into the pulse sequence for the purpose of determining the displacement of a portion of the object.

40. A magnetic resonance imaging apparatus generating a spin echo pulse sequence [in order] *configured* to operate the apparatus [in]*that is configured for* imaging an object [that permits at least one of lengthening usable echo-train duration, reducing power deposition and incorporating desired image contrast into the tissue signal evolutions], the apparatus comprising:

a main magnet system generating a steady magnetic field;

a gradient magnet system generating temporary gradient magnetic fields;

a radio-frequency transmitter system generating radio-frequency pulses;

a radio-frequency receiver system receiving magnetic resonance signals;

a reconstruction unit reconstructing an image of the object from the received magnetic resonance signals; and a control unit generating signals controlling the gradient magnet system, the radio-frequency transmitter system, the radio-frequency receiver system, and the reconstruction unit, wherein the control unit generates signals causing:

a) providing contrast-preparation, said contrast-preparation comprising generating at least one of at least one radio-frequency pulse, at least one magnetic-field gradient pulse, and at least one time delay, whereby said contrast preparation encodes the magnetization with at least one desired image contrast;

b) calculating flip angles and phases of refocusing radio-frequency pulses that are applied in a data-acquisition step, wherein said calculation provides desired prescribed signal evolution and desired overall signal level *that permit, during said data-acquisition step, at least one of lengthening usable echo-train duration, reducing power deposition and incorporating desired image contrast into the tissue signal evolutions*, said calculation comprises:

i) selecting values of T1 and T2 relaxation times and selecting proton density;

ii) selecting a prescribed time course of the amplitudes and phases of the radio-frequency magnetic resonance signals that are generated by said refocusing radio-frequency pulses; and iii) selecting characteristics of said contrast-preparation step, said data-acquisition step and a magnetization-recovery step, with the exception of the flip angles and phases of the refocusing radio-frequency pulses that are to be calculated; and c) providing said-data acquisition step based on a spin echo train acquisition, said data-acquisition step comprises:

i) an excitation radio-frequency pulse having a flip angle and phase, ii) at least two refocusing radio-frequency pulses, each having a flip angle and phase as determined by said calculation step, and iii) magnetic-field gradient pulses that encode spatial information into at least one of said radio-frequency magnetic resonance signals that follow at least one of said refocusing radio-frequency pulses;

d) providing magnetization-recovery, said magnetization-recovery comprises a time delay to allow magnetization to relax; and e) repeating steps (a) through (d) until a predetermined extent of spatial frequency space has been sampled.

41. A magnetic resonance imaging apparatus generating a spin echo pulse sequence [in order] *configured* to operate the apparatus [in] *that is configured for* imaging an object [that permits at least one of lengthening usable echo-train duration, reducing power deposition and incorporating desired image contrast into the tissue signal evolutions], the apparatus comprising:

main magnet means generating a steady magnetic field;

gradient magnet means generating temporary gradient magnetic fields;

radio-frequency transmitter means generating radio-frequency pulses;

radio-frequency receiver means receiving magnetic resonance signals;[.]

reconstruction means reconstructing an image of the object from the received magnetic resonance signals; and control means generating signals controlling the gradient magnet means, the radio-frequency transmitter means, the radio-frequency receiver means, and the reconstruction means, wherein the control means generates signals causing:

a) providing contrast-preparation, said contrast-preparation comprising generating at least one of at least one radio-frequency pulse, at least one magnetic-field gradient pulse, and at least one time delay, whereby said contrast preparation encodes the magnetization with at least one desired image contrast;

b) calculating flip angles and phases of refocusing radio-frequency pulses that are applied in a data-acquisition step, wherein said calculation provides desired prescribed signal evolution and desired overall signal level *that permit, during said data-acquisition step, at least one of lengthening usable echo-train duration, reducing power deposition and incorporating desired image contrast into the tissue signal evolutions*, said calculation comprises:

i) selecting values of T1 and T2 relaxation times and selecting proton density;

ii) selecting a prescribed time course of the amplitudes and phases of the radio-frequency magnetic resonance signals that are generated by said refocusing radio-frequency pulses; and iii) selecting characteristics of said contrast-preparation step, said data-acquisition step and a magnetization-recovery step, with the exception of the flip angles and phases of the refocusing radio-frequency pulses that are to be calculated;

c) providing said-data acquisition step based on a spin echo train acquisition, said data-acquisition step comprises:

i) an excitation radio-frequency pulse having a flip angle and phase, ii) at least two refocusing radio-frequency pulses, each having a flip angle and phase as determined by said calculation step, and iii) magnetic-field gradient pulses that encode spatial information into at least one of said radio-frequency magnetic resonance signals that follow at least one of said refocusing radio-frequency pulses;

d) providing magnetization-recovery, said magnetization-recovery comprises a time delay to allow magnetization to relax; and e) repeating steps (a) through (d) until a predetermined extent of spatial frequency space has been sampled.

42. A *non-transitory* computer readable media carrying encoded program instructions for causing a programmable magnetic resonance imaging apparatus to perform the method of claim 1.

43. A [computer program provided on a] *non-transitory* computer [useable] readable medium having computer program logic enabling at least one processor in a magnetic resonance imaging apparatus to generate a spin echo pulse sequence [that permits at least one of lengthening usable echo-train duration, reducing power deposition and incorporating desired image contrast into the tissue signal evolutions], said computer program logic comprising:

a) providing contrast-preparation, said contrast-preparation comprising generating at least one of at least one radio-frequency pulse, at least one magnetic-field gradient pulse, and at least one time delay, whereby said contrast preparation encodes the magnetization with at least one desired image contrast;

b) calculating flip angles and phases of refocusing radio-frequency pulses that are applied in a data-acquisition step, wherein said calculation provides desired prescribed signal evolution and desired overall signal level *that permit, during said data-acquistion step, at least one of lengthening usable echo-train duration, reducing power deposition and incorporating desired image contrast into the tissue signal evolutions*, said calculation comprises:

i) selecting values of T1 and T2 relaxation times and selecting proton density;

ii) selecting a prescribed time course of the amplitudes and phases of the radio-frequency magnetic resonance signals that are generated by said refocusing radio-frequency pulses; and iii) selecting characteristics of said contrast-preparation step, said data-acquisition step and a magnetization-recovery step, with the exception of the flip angles and phases of the refocusing radio-frequency pulses that are to be calculated; and c) providing said-data acquisition step based on a spin echo train acquisition, said data-acquisition step comprises:

i) an excitation radio-frequency pulse having a flip angle and phase;

ii) at least two refocusing radio-frequency pulses, each having a flip angle and phase as determined by said calculation step; and iii) magnetic-field gradient pulses that encode spatial information into at least one of said radio-frequency magnetic resonance signals that follow at least one of said refocusing radio-frequency pulses;

d) providing magnetization-recovery, said magnetization-recovery comprises a time delay to allow magnetization to relax; and e) repeating steps (a) through (d) until a predetermined extent of spatial frequency space has been sampled.

[44. The method of claim 40, wherein at least one of said contrast-preparation and magnetization-recovery steps is omitted.]

[45. The method of claim 41, wherein at least one of said contrast-preparation and magnetization-recovery steps is omitted.]

[46. The method of claim 43, wherein at least one of said contrast-preparation and magnetization-recovery steps is omitted.]

*47. The method of claim 1, wherein said calculation of the flip angles and phases occurs once prior to execution of the pulse sequence.*

*48. The method of claim 1, wherein said calculation of the flip angles and phases occurs substantially simultaneous with the execution of the pulse sequence.*

*49. The method of claim 1, wherein at least two of the calculation sub-steps are performed substantially simultaneously.*

*50. The method of claim 1, wherein the performance of at least one of the calculation sub-steps (b) i through (b) iii in step (b) implicitly performs at least one of the other said calculation sub-steps.*

*51. A method for generating a spin echo pulse sequence for operating a magnetic resonance imaging apparatus for imaging an object, said method comprising:*

*a) calculating flip angles and phases of refocusing radio-frequency pulses that are applied in a data-acquisition step, wherein said calculation provides desired prescribed signal evolution and desired overall signal level that permit, during said data-acquisition step, at least one of lengthening usable echo-train duration, reducing power deposition and incorporating desired image contrast into the tissue signal evolutions, said calculation comprises:*

*i) selecting values of T1 and T2 relaxation times and selecting proton density;*

*ii) selecting a prescribed time course of the amplitudes and phases of the radio-frequency magnetic resonance signals that are generated by said refocusing radio-frequency pulses; and*

*iii) selecting characteristics of said data-acquisition step and a magnetization-recovery step, with the exception of the flip angles and phases of the refocusing radio-frequency pulses that are to be calculated; and*

*b) providing said data-acquisition step based on a spin echo train acquisition, said data-acquisition step comprises:*

*i) an excitation radio-frequency pulse having a flip angle and phase;*

*ii) at least two refocusing radio-frequency pulses, each having a flip angle and phase as determined by said calculation step; and*

*iii) magnetic-field gradient pulses that encode spatial information into at least one of said radio-frequency magnetic resonance signals that follow at least one of said refocusing radio-frequency pulses;*

*c) providing magnetization-recovery, said magnetization-recovery comprises a time delay to allow magnetization to relax; and*

*d) repeating at least one of steps (a) through (c) until a predetermined extent of spatial frequency space has been sampled.*

*52. The method of claim 51, wherein said calculation of the flip angles and phases occurs either prior to or substantially simultaneous with execution of the pulse sequence, and wherein the performance of at least one of the calculation sub-steps (a) i through (a) iii in step (a) implicitly performs at least one of the other said calculation sub-steps.*

*53. A method for generating a spin echo pulse sequence for operating a magnetic resonance imaging apparatus for imaging an object, said method comprising:*

*a) providing contrast-preparation, said contrast-preparation comprising generating at least one of at least one radio-frequency pulse, at least one magnetic-field gradient pulse, and at least one time delay, whereby said contrast preparation encodes the magnetization with at least one desired image contrast;*

*b) calculating flip angles and phases of refocusing radio-frequency pulses that are applied in a data-acquisition step, wherein said calculation provides desired prescribed signal evolution and desired overall signal level that permit, during said data-acquisition step, at least one of lengthening usable echo-train duration, reducing power deposition and incorporating desired image contrast into the tissue signal evolutions, said calculation comprises:*

*i) selecting values of T1 and T2 relaxation times and selecting proton density;*

*ii) selecting a prescribed time course of the amplitudes and phases of the radio-frequency magnetic reso-*

*nance signals that are generated by said refocusing radio-frequency pulses; and*

*iii) selecting characteristics of said contrast-preparation step and said data-acquisition step, with the exception of the flip angles and phases of the refocusing radio-frequency pulses that are to be calculated;*

*c) providing said data-acquisition step based on a spin echo train acquisition, said data-acquisition step comprises:*

*i) an excitation radio-frequency pulse having a flip angle and phase;*

*ii) at least two refocusing radio-frequency pulses, each having a flip angle and phase as determined by said calculation step; and*

*iii) magnetic-field gradient pulses that encode spatial information into at least one of said radio-frequency magnetic resonance signals that follow at least one of said refocusing radio-frequency pulses; and*

*d) repeating at least one of steps (a) through (c) until a predetermined extent of spatial frequency space has been sampled.*

*54. The apparatus of claim 40, wherein said calculation of the flip angles and phases occurs once prior to execution of the pulse sequence.*

*55. The apparatus of claim 40, wherein said calculation of the flip angles and phases occurs substantially simultaneous with the execution of the pulse sequence.*

*56. The apparatus of claim 40, wherein at least two of the calculation sub-steps are performed substantially simultaneously.*

*57. The apparatus of claim 40, wherein the performance of at least one of the calculation sub-steps (b) i through (b) iii in step (b) implicitly performs at least one of the other said calculation sub-steps.*

*58. A magnetic resonance imaging apparatus generating a spin echo pulse sequence configured to operate the apparatus that is configured for imaging an object, the apparatus comprising:*

*a main magnet system generating a steady magnetic field;*

*a gradient magnet system generating temporary gradient magnetic fields;*

*a radio-frequency transmitter system generating radio-frequency pulses;*

*a radio-frequency receiver system receiving magnetic resonance signals;*

*a reconstruction unit reconstructing an image of the object from the received magnetic resonance signals; and*

*a control unit generating signals controlling the gradient magnet system, the radio-frequency transmitter system, the radio-frequency receiver system, and the reconstruction unit, wherein the control unit generates signals causing:*

*a) calculating flip angles and phases of refocusing radio-frequency pulses that are applied in a data-acquisition step, wherein said calculation provides desired prescribed signal evolution and desired overall signal level that permit, during said data-acquisition step, at least one of lengthening usable echo-train duration, reducing power deposition and incorporating desired image contrast into the tissue signal evolutions, said calculation comprises:*

*i) selecting values of T1 and T2 relaxation times and selecting proton density;*

*ii) selecting a prescribed time course of the amplitudes and phases of the radio-frequency magnetic resonance signals that are generated by said refocusing radio-frequency pulses; and*

*iii) selecting characteristics of said data-acquisition step and a magnetization-recovery step, with the exception of the flip angles and phases of the refocusing radio-frequency pulses that are to be calculated;*

*b) providing said data-acquisition step based on a spin echo train acquisition, said data-acquisition step comprises:*

*i) an excitation radio-frequency pulse having a flip angle and phase,*

*ii) at least two refocusing radio-frequency pulses, each having a flip angle and phase as determined by said calculation step, and*

*iii) magnetic-field gradient pulses that encode spatial information into at least one of said radio-frequency magnetic resonance signals that follow at least one of said refocusing radio-frequency pulses;*

*c) providing magnetization-recovery, said magnetization-recovery comprises a time delay to allow magnetization to relax; and*

*d) repeating at least one of steps (a) through (c) until a predetermined extent of spatial frequency space has been sampled.*

*59. The method of claim 58, wherein said calculation of the flip angles and phases occurs either prior to or substantially simultaneous with execution of the pulse sequence, and wherein the performance of at least one of the calculation sub-steps (a) i through (a) iii in step (a) implicitly performs at least one of the other said calculation sub-steps.*

*60. A magnetic resonance imaging apparatus generating a spin echo pulse sequence configured to operate the apparatus that is configured for imaging an object, the apparatus comprising:*

*a main magnet system generating a steady magnetic field;*

*a gradient magnet system generating temporary gradient magnetic fields;*

*a radio-frequency transmitter system generating radio-frequency pulses;*

*a radio-frequency receiver system receiving magnetic resonance signals;*

*a reconstruction unit reconstructing an image of the object from the received magnetic resonance signals; and*

*a control unit generating signals controlling the gradient magnet system, the radio-frequency transmitter system, the radio-frequency receiver system, and the reconstruction unit, wherein the control unit generates signals causing:*

*a) providing contrast-preparation, said contrast-preparation comprising generating at least one of at least one radio-frequency pulse, at least one magnetic-field gradient pulse, and at least one time delay, whereby said contrast preparation encodes the magnetization with at least one desired image contrast;*

*b) calculating flip angles and phases of refocusing radio-frequency pulses that are applied in a data-acquisition step, wherein said calculation provides desired prescribed signal evolution and desired overall signal level that permit, during said data-acquisition step, at least one of lengthening usable echo-train duration, reducing power deposition and incorporating desired image contrast into the tissue signal evolutions, said calculation comprises:*

*i) selecting values of T1 and T2 relaxation times and selecting proton density;*

*ii) selecting a prescribed time course of the amplitudes and phases of the radio-frequency magnetic*

*resonance signals that are generated by said refocusing radio-frequency pulses; and*

*iii) selecting characteristics of said contrast-preparation step and said data-acquisition step, with the exception of the flip angles and phases of the refocusing radio-frequency pulses that are to be calculated;*

*c) providing said data-acquisition step based on a spin echo train acquisition, said data-acquisition step comprises:*

*i) an excitation radio-frequency pulse having a flip angle and phase,*

*ii) at least two refocusing radio-frequency pulses, each having a flip angle and phase as determined by said calculation step, and*

*iii) magnetic-field gradient pulses that encode spatial information into at least one of said radio-frequency magnetic resonance signals that follow at least one of said refocusing radio-frequency pulses; and*

*d) repeating at least one of steps (a) through (c) until a predetermined extent of spatial frequency space has been sampled.*

*61. The apparatus of claim 41, wherein said calculation of the flip angles and phases occurs once prior to execution of the pulse sequence.*

*62. The apparatus of claim 41, wherein said calculation of the flip angles and phases occurs substantially simultaneous with the execution of the pulse sequence.*

*63. The apparatus of claim 41, wherein at least two of the calculation sub-steps are performed substantially simultaneously.*

*64. The apparatus of claim 41, wherein the performance of at least one of the calculation sub-steps (b) i through (b) iii in step (b) implicitly performs at least one of the other said calculation sub-steps.*

*65. A magnetic resonance imaging apparatus generating a spin echo pulse sequence configured to operate the apparatus that is configured for imaging an object, the apparatus comprising:*

*main magnet means generating a steady magnetic field;*

*gradient magnet means generating temporary gradient magnetic fields;*

*radio-frequency transmitter means generating radio-frequency pulses;*

*radio-frequency receiver means receiving magnetic resonance signals;*

*reconstruction means reconstructing an image of the object from the received magnetic resonance signals; and*

*control means generating signals controlling the gradient magnet means, the radio-frequency transmitter means, the radio-frequency receiver means, and the reconstruction means, wherein the control means generates signals causing:*

*a) calculating flip angles and phases of refocusing radio-frequency pulses that are applied in a data-acquisition step, wherein said calculation provides desired prescribed signal evolution and desired overall signal level that permit, during said data-acquisition step, at least one of lengthening usable echo-train duration, reducing power deposition and incorporating desired image contrast into the tissue signal evolutions, said calculation comprises:*

*i) selecting values of T1 and T2 relaxation times and selecting proton density;*

*ii) selecting a prescribed time course of the amplitudes and phases of the radio-frequency magnetic resonance signals that are generated by said refocusing radio-frequency pulses; and*

*iii) selecting characteristics of said data-acquisition step and a magnetization-recovery step, with the exception of the flip angles and phases of the refocusing radio-frequency pulses that are to be calculated;*

*b) providing said data-acquisition step based on a spin echo train acquisition, said data-acquisition step comprises:*

*i) an excitation radio-frequency pulse having a flip angle and phase,*

*ii) at least two refocusing radio-frequency pulses, each having a flip angle and phase as determined by said calculation step, and*

*iii) magnetic-field gradient pulses that encode spatial information into at least one of said radio-frequency magnetic resonance signals that follow at least one of said refocusing radio-frequency pulses;*

*c) providing magnetization-recovery, said magnetization-recovery comprises a time delay to allow magnetization to relax; and*

*d) repeating at least one of steps (a) through (c) until a predetermined extent of spatial frequency space has been sampled.*

*66. The apparatus of claim 65, wherein said calculation of the flip angles and phases occurs either prior to or substantially simultaneous with execution of the pulse sequence, and wherein the performance of at least one of the calculation sub-steps (a) i through (a) iii in step (a) implicitly performs at least one of the other said calculation sub-steps.*

*67. A magnetic resonance imaging apparatus generating a spin echo pulse sequence configured to operate the apparatus that is configured for imaging an object, the apparatus comprising:*

*main magnet means generating a steady magnetic field;*

*gradient magnet means generating temporary gradient magnetic fields;*

*radio-frequency transmitter means generating radio-frequency pulses;*

*radio-frequency receiver means receiving magnetic resonance signals;*

*reconstruction means reconstructing an image of the object from the received magnetic resonance signals; and*

*control means generating signals controlling the gradient magnet means, the radio-frequency transmitter means, the radio-frequency receiver means, and the reconstruction means, wherein the control means generates signals causing:*

*a) providing contrast-preparation, said contrast-preparation comprising generating at least one of at least one radio-frequency pulse, at least one magnetic-field gradient pulse, and at least one time delay, whereby said contrast preparation encodes the magnetization with at least one desired image contrast;*

*b) calculating flip angles and phases of refocusing radio-frequency pulses that are applied in a data-acquisition step, wherein said calculation provides desired prescribed signal evolution and desired overall signal level that permit, during said data acquisition step, at least one of lengthening usable echo-train duration, reducing power deposition and incorporat-*

*ing desired image contrast into the tissue signal evolutions, said calculation comprises:*

*i) selecting values of T1 and T2 relaxation times and selecting proton density;*

*ii) selecting a prescribed time course of the amplitudes and phases of the radio-frequency magnetic resonance signals that are generated by said refocusing radio-frequency pulses; and*

*iii) selecting characteristics of said contrast-preparation step and said data-acquisition step, with the exception of the flip angles and phases of the refocusing radio-frequency pulses that are to be calculated;*

*c) providing said data-acquisition step based on a spin echo train acquisition, said data-acquisition step comprises:*

*i) an excitation radio-frequency pulse having a flip angle and phase,*

*ii) at least two refocusing radio-frequency pulses, each having a flip angle and phase as determined by said calculation step, and*

*iii) magnetic-field gradient pulses that encode spatial information into at least one of said radio-frequency magnetic resonance signals that follow at least one of said refocusing radio-frequency pulses; and*

*d) repeating at least one of steps (a) through (c) until a predetermined extent of spatial frequency space has been sampled.*

*68. The non-transitory computer readable medium of claim 43, wherein said calculation of the flip angles and phases occurs once prior to execution of the pulse sequence.*

*69. The non-transitory computer readable medium of claim 43, wherein said calculation of the flip angles and phases occurs substantially simultaneous with the execution of the pulse sequence.*

*70. The non-transitory computer readable medium of claim 43, wherein at least two of the calculation sub-steps are performed substantially simultaneously.*

*71. The non-transitory computer readable medium of claim 43, wherein the performance of at least one of the calculation sub-steps (b) i through (b) iii in step (b) implicitly performs at least one of the other said calculation sub-steps.*

*72. A non-transitory computer readable medium having computer program logic enabling at least one processor in a magnetic resonance imaging apparatus to generate a spin echo pulse sequence, said computer program logic comprising:*

*a) calculating flip angles and phases of refocusing radio-frequency pulses that are applied in a data-acquisition step, wherein said calculation provides desired prescribed signal evolution and desired overall signal level that permit, during said data-acquisition step, at least one of lengthening usable echo-train duration, reducing power deposition and incorporating desired image contrast into the tissue signal evolutions, said calculation comprises:*

*i) selecting values of T1 and T2 relaxation times and selecting proton density;*

*ii) selecting a prescribed time course of the amplitudes and phases of the radio-frequency magnetic resonance signals that are generated by said refocusing radio-frequency pulses; and*

*iii) selecting characteristics of said data-acquisition step and a magnetization-recovery step, with the exception of the flip angles and phases of the refocusing radio-frequency pulses that are to be calculated;*

*b) providing said data-acquisition step based on a spin echo train acquisition, said data-acquisition step comprises:*

*i) an excitation radio-frequency pulse having a flip angle and phase;*

*ii) at least two refocusing radio-frequency pulses, each having a flip angle and phase as determined by said calculation step; and*

*iii) magnetic-field gradient pulses that encode spatial information into at least one of said radio-frequency magnetic resonance signals that follow at least one of said refocusing radio-frequency pulses;*

*c) providing magnetization-recovery, said magnetization-recovery comprises a time delay to allow magnetization to relax; and*

*d) repeating at least one of steps (a) through (c) until a predetermined extent of spatial frequency space has been sampled.*

*73. The non-transitory computer readable medium of claim 72, wherein said calculation of the flip angles and phases occurs either prior to or substantially simultaneous with execution of the pulse sequence, and wherein the performance of at least one of the calculation sub-steps (a) i through (a) iii in step (a) implicitly performs at least one of the other said calculation sub-steps.*

*74. A non-transitory computer readable medium having computer program logic enabling at least one processor in a magnetic resonance imaging apparatus to generate a spin echo pulse sequence, said computer program logic comprising:*

*a) providing contrast-preparation, said contrast-preparation comprising generating at least one of at least one radio-frequency pulse, at least one magnetic-field gradient pulse, and at least one time delay, whereby said contrast preparation encodes the magnetization with at least one desired image contrast;*

*b) calculating flip angles and phases of refocusing radio-frequency pulses that are applied in a data-acquisition step, wherein said calculation provides desired prescribed signal evolution and desired overall signal level that permit, during said data-acquisition step, at least one of lengthening usable echo-train duration, reducing power deposition and incorporating desired image contrast into the tissue signal evolutions, said calculation comprises:*

*i) selecting values of T1 and T2 relaxation times and selecting proton density;*

*ii) selecting a prescribed time course of the amplitudes and phases of the radio-frequency magnetic resonance signals that are generated by said refocusing radio-frequency pulses; and*

*iii) selecting characteristics of said contrast-preparation step and said data-acquisition step, with the exception of the flip angles and phases of the refocusing radio-frequency pulses that are to be calculated;*

*c) providing said data-acquisition step based on a spin echo train acquisition, said data-acquisition step comprises:*

*i) an excitation radio-frequency pulse having a flip angle and phase;*

*ii) at least two refocusing radio-frequency pulses, each having a flip angle and phase as determined by said calculation step; and*

*iii) magnetic-field gradient pulses that encode spatial information into at least one of said radio-frequency magnetic resonance signals that follow at least one of said refocusing radio-frequency pulses; and*

*d) repeating at least one of steps (a) through (c) until a predetermined extent of spatial frequency space has been sampled.*

*75. A method for generating a spin-echo pulse sequence for operating a magnetic resonance imaging apparatus for imaging an object, said method comprising:*

*providing a data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle,*

*wherein, to permit during said data-acquisition step at least one of lengthening usable echo-train duration, reducing power deposition and incorporating desired image contrast into the signal evolutions, at least one of said angles is selected to vary among pulses to yield a signal evolution for the associated train of spin echoes for at least one first substance of interest in said object, with corresponding T1 and T2 relaxation times and spin density of interest, and to yield a signal evolution for the associated train of spin echoes for at least one second substance of interest in said object, with corresponding T1 and T2 relaxation times and spin density of interest,*

*wherein said signal evolutions result in T2-weighted contrast in the corresponding image(s) that is substantially the same as T2-weighted contrast that would be provided by imaging said object by using a turbo-spin-echo or fast-spin-echo spin-echo-train pulse sequence that has constant flip angles, with values of 180 degrees, for the refocusing radio-frequency pulses, and*

*wherein at least one of the duration of the spin-echo trains for said signal evolutions for said substances is at least twice the duration of the spin-echo train for said turbo-spin-echo or fast-spin-echo spin-echo-train pulse sequence and an effective echo time corresponding to said spin-echo trains for said signal evolutions for said substances is at least twice an effective echo time for said turbo-spin-echo or fast-spin-echo spin-echo-train pulse sequence;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding; and*

*repeating said data-acquisition step until a predetermined extent of spatial frequency space has been sampled.*

*76. The method of claim 75, wherein at least one of a time delay and at least one magnetic-field gradient pulse occurs between the end of at least one spin-echo train and the excitation radio-frequency pulse associated with the next spin-echo train.*

*77. The method of claim 75, wherein at least one repetition of said data-acquisition step is for the purpose of stabilizing the response of at least one of magnetization related system and apparatus related hardware system.*

*78. The method of 75, wherein for at least one repetition of said data-acquisition step at least one of at least a fraction of the sampled data is discarded and no data is sampled.*

*79. The method of claim 75, wherein said flip angles and phase angles for the refocusing radio-frequency pulses are calculated using an appropriate analytical or computer-based algorithm, either prior to or substantially simultaneous with the execution of the pulse sequence.*

*80. The method of claim 75, wherein said flip angles for said refocusing radio-frequency pulses decrease, within the first approximately 15% of the total number of echoes, to a value that is no more than approximately one-third of the initial flip angle for said refocusing radio-frequency pulses, and said flip angles then increase for the remaining echoes in said train of spin echoes.*

*81. The method of claim 80, wherein said flip angles for said refocusing radio-frequency pulses reach, at 50% of the total number of echoes in said train of spin echoes, a value approximately midway between said initial flip angle and the lowest flip angle.*

*82. The method of claim 75, wherein said flip angles and phase angles for said refocusing radio-frequency pulses are, in addition, selected to reduce power deposition compared to power deposition that would be achieved by using constant flip angles, with values of 180 degrees, for the refocusing radio-frequency pulses.*

*83. The method of claim 82, wherein the power deposition at a magnetic field strength of 3 Tesla for the method of claim 75 is below regulatory limits while power deposition that would be achieved by using constant flip angles, with values of 180 degrees, for the refocusing radio-frequency pulses exceeds regulatory limits.*

*84. The method of claim 75, wherein said effective echo time corresponding to said spin-echo trains for said signal evolutions for said substances is at least twice said effective echo time for said turbo-spin-echo or fast-spin-echo spin-echo-train pulse sequence and said duration of the spin-echo trains for said signal evolutions for said substances is at least twice said duration of the spin-echo train for said turbo-spin-echo or fast-spin-echo spin-echo-train pulse sequence.*

*85. The method of claim 75, wherein at least one of said effective echo time corresponding to said spin-echo trains for said signal evolutions for said substances is at least on the order of 300 milliseconds and said duration of the spin-echo trains for said signal evolutions for said substances is at least on the order of 600 milliseconds.*

*86. The method of claim 75, wherein said effective echo time corresponding to said spin-echo trains for said signal evolutions for said substances is at least on the order of 300 milliseconds and said duration of the spin-echo trains for said signal evolutions for said substances is at least on the order of 600 milliseconds.*

*87. The method of claim 75, wherein said effective echo time for said turbo-spin-echo or fast-spin-echo spin-echo-train pulse sequence has a value typical for T2-weighted clinical magnetic resonance imaging.*

*88. The method of claim 75, wherein said duration of the spin-echo trains for said signal evolutions for said substances is greater than approximately four times the T2 relaxation time for at least one of said substances.*

*89. The method of claim 75, wherein said effective echo time corresponding to said spin-echo trains for said signal evolutions for said substances is greater than approximately two times the T2 relaxation time for at least one of said substances.*

*90. The method of claim 75, wherein said first and second substances of interest are brain white matter and brain gray matter.*

*91. The method of claim 90, wherein at least one of said duration of the spin-echo train for said turbo-spin-echo or fast-spin-echo spin-echo-train pulse sequence is less than 300 milliseconds and said effective echo time for said turbo-spin-echo or fast-spin-echo spin-echo-train pulse sequence has a value typical for T2-weighted clinical magnetic resonance imaging of the brain.*

*92. The method of claim 75, wherein said first and second substances of interest are spinal cord white matter and spinal cord gray matter.*

*93. The method of claim 75, wherein at least one of said substances of interest is at least one of cartilage, ligament and muscle.*

*94. The method of claim 90, wherein said duration of the spin-echo train for said turbo-spin-echo or fast-spin-echo spin-echo-train pulse sequence is less than 300 milliseconds and said effective echo time for said turbo-spin-echo or fast-spin-echo spin-echo-train pulse sequence has a value typical for T2-weighted clinical magnetic resonance imaging of the brain.*

*95. The method of claim 75, wherein the number of refocusing radio-frequency pulses following at least one said excitation radio-frequency pulse is greater than 50.*

*96. The method of claim 75, wherein the number of refocusing radio-frequency pulses following at least one said excitation radio-frequency pulse is greater than 100.*

*97. The method of claim 75, wherein a contrast preparation comprising generating at least one of at least one radio-frequency pulse, at least one magnetic-field gradient pulse, and at least one time delay, whereby said contrast preparation encodes the magnetization with at least one desired image contrast, immediately precedes at least one of said excitation radio-frequency pulses.*

*98. The method of claim 97, wherein said contrast preparation comprises at least an inversion radio-frequency pulse followed by a time delay.*

*99. The method of claim 98, wherein said time delay is chosen so that the longitudinal magnetization associated with fluid, such as cerebrospinal fluid, is passing through substantially zero when at least one said excitation radio-frequency pulse is applied.*

*100. The method of claim 97, wherein at least one of the radio-frequency pulses is at least one of spatially selective in one of one, two and three dimensions, chemically selective, and adiabatic.*

*101. The method of claim 97, wherein at least one said contrast preparation is initiated by a trigger signal to synchronize the pulse sequence with at least one of at least one external temporal event and at least one internal temporal event.*

*102. The method of claim 101, wherein said external and internal events comprise at least one of at least one voluntary action, at least one involuntary action, at least one respiratory cycle and at least one cardiac cycle.*

*103. The method of claim 97, wherein at least one of at least one radio-frequency pulse and at least one magnetic-field gradient pulse is applied as part of at least one said contrast preparation for the purpose of stabilizing the response of at least one of magnetization related system and apparatus related hardware system.*

*104. The method of claim 75, wherein the flip angle for at least one of the refocusing radio-frequency pulses in the first half of at least one spin-echo train is chosen to be sufficiently low to cause the signal from flowing or pulsating fluid in resulting images to be suppressed.*

*105. The method of claim 104, wherein said flip angle is less than 30 degrees.*

*106. The method of claim 75, wherein a two-dimensional plane of spatial-frequency space is sampled.*

*107. The method of claim 75, wherein a three-dimensional volume of spatial-frequency space is sampled.*

*108. The method of claim 75, wherein at least one said data-acquisition step is initiated by a trigger signal to synchronize the pulse sequence with at least one of at least one external temporal event and at least one internal temporal event.*

*109. The method of claim 108, wherein said external and internal events comprise at least one of at least one voluntary action, at least one involuntary action, at least one respiratory cycle and at least one cardiac cycle.*

*110. The method of claim 75, wherein at least one of at least one radio-frequency pulse and at least one magnetic-field gradient pulse is applied as part of at least one said data-acquisition step for the purpose of stabilizing the response of at least one of magnetization related system and apparatus related hardware system.*

*111. The method of claim 75, wherein the time periods between consecutive refocusing radio-frequency pulses applied during said data-acquisition steps are all of equal duration.*

*112. The method of claim 75, wherein the time periods between consecutive refocusing radio-frequency pulses applied during said data-acquisition steps vary in duration amongst pairs of refocusing radio-frequency pulses during at least one said data-acquisition step.*

*113. The method of claim 75 wherein all radio-frequency pulses are at least one of non-spatially selective and non-chemically selective.*

*114. The method of claim 75, wherein at least one of the radio-frequency pulses is at least one of spatially selective in one of one, two and three dimensions, chemically selective, and adiabatic.*

*115. The method of claim 75, wherein during at least one said data-acquisition step, the phase difference between the phase angle for the excitation radio-frequency pulse and the phase angles for all refocusing radio-frequency pulses is substantially 90 degrees.*

*116. The method of claim 75, wherein during at least one said data-acquisition step, the phase difference between the phase angle for any refocusing radio-frequency pulse and the phase angle for the immediately subsequent refocusing radio-frequency pulse is substantially 180 degrees, and the phase difference between the phase angle for the excitation radio-frequency pulse and the phase angle for the first refocusing pulse is one of substantially 0 degrees and substantially 180 degrees.*

*117. The method of claim 75, wherein the flip angle for the excitation radio-frequency pulse is substantially one-half of the flip angle for the first refocusing radio-frequency pulse.*

*118. The method of claim 75, wherein the spatial-encoding magnetic-field gradient pulses applied during each said data-acquisition step are configured so as to collect data, following each of at least one of the refocusing radio-frequency pulses, for one line in spatial-frequency space which is parallel to all other lines of data so collected, so as to collect the data using a magnetic resonance imaging technique selected from the group consisting of rapid acquisition with relaxation enhancement (RARE), fast spin echo (FSE), and turbo spin echo (TSE or TurboSE).*

*119. The method of claim 75, wherein the spatial-encoding magnetic-field gradient pulses applied during each said data-acquisition step are configured so as to collect data, following each of at least one of the refocusing radio-frequency pulses, for two or more lines in spatial-frequency space which are parallel to all other lines of data so collected, so as to collect the data using a magnetic resonance imaging technique selected from the group consisting of gradient and spin echo (GRASE) and turbo gradient spin echo (TGSE or TurboGSE).*

*120. The method of claim 75, wherein the spatial-encoding magnetic-field gradient pulses applied during each said data-acquisition step are configured so as to collect data, following each of at least one of the refocusing radio-frequency pulses, for one or more lines in spatial-frequency space, each of which pass through one of a single point in spatial-frequency space and a single line in spatial-frequency space, so as to collect the data using a magnetic resonance imaging technique selected from the group consisting of radial sampling and projection-reconstruction sampling.*

*121. The method of claim 120, wherein the single point in spatial-frequency space is substantially zero spatial frequency.*

*122. The method of claim 120, wherein the single line in spatial-frequency space includes substantially zero spatial frequency.*

*123. The method of claim 75, wherein the spatial-encoding magnetic-field gradient pulses applied during each said data-acquisition step are configured so as to collect data, following each of at least one of the refocusing radio-frequency pulses, along a spiral trajectory in spatial-frequency space, each trajectory of which is contained in one of two dimensions and three dimensions, and each trajectory of which passes through one of a single point in spatial-frequency space and a single line in spatial-frequency space.*

*124. The method of claim 123, wherein the single point in spatial-frequency space is substantially zero spatial frequency.*

*125. The method of claim 123, wherein the single line in spatial-frequency space includes substantially zero spatial frequency.*

*126. The method of 75, wherein the spatial-encoding magnetic-field gradient pulses applied during at least one of said data-acquisition steps are configured to collect sufficient spatial-frequency data to reconstruct at least two image sets, each of which exhibits contrast properties different from the other image sets.*

*127. The method of claim 126, wherein at least some of the spatial-frequency data collected during at least one of said data-acquisition steps is used in the reconstruction of more than one image set, whereby the data is shared between image sets.*

*128. The method of claim 75, wherein the spatial-encoding magnetic-field gradient pulses applied during at least one of said data-acquisition steps are configured so that, for the echo following at least one of the refocusing radio-frequency pulses, at least one of the first moment, the second moment and the third moment corresponding to at least one of the spatial-encoding directions is approximately zero.*

*129. The method of claim 75, wherein the spatial-encoding magnetic-field gradient pulses applied during at least one of said data-acquisition steps are configured so that, following at least one of the refocusing radio-frequency pulses, the zeroth moment measured over the time period between said refocusing radio-frequency pulse and the immediately consecutive refocusing radio-frequency pulse is approximately zero for at least one of the spatial-encoding directions.*

*130. The method of claim 75, wherein during all said data-acquisition steps the duration of all data-sampling periods are equal.*

*131. The method of claim 75, wherein during at least one of said data-acquisition steps at least one of the data-sampling periods has a duration that differs from the duration of at least one other data-sampling period.*

*132. The method of claim 75, wherein the spatial-encoding magnetic-field gradient pulses applied during said data-acquisition steps are configured so that the extent of spatial-frequency space sampled along at least one of the spatial-encoding directions is not symmetric with respect to zero spatial frequency, whereby a larger extent of spatial-frequency space is sampled to one side of zero spatial frequency as compared to the opposite side of zero spatial frequency.*

*133. The method of claim 132 wherein said spatial-frequency data is reconstructed using a partial-Fourier reconstruction algorithm.*

*134. The method of claim 75, wherein during at least one of said data-acquisition steps the temporal order in which spatial-frequency data is collected for at least one of the spatial-encoding directions is based on achieving at least one of selected contrast properties in the image and selected properties of the corresponding point spread function.*

*135. The method of claim 75, wherein during at least one of said data-acquisition steps the temporal order in which spatial-frequency data is collected is different from that for at least one other data-acquisition step.*

*136. The method of claim 75, wherein during at least one of said data-acquisition steps the extent of spatial-frequency data that is collected is different from that for at least one other data-acquisition step.*

*137. The method of claim 75, wherein during at least one of said data-acquisition steps spatial encoding of the radio-frequency magnetic resonance signal that follows at least one of the refocusing radio-frequency pulses is performed using only phase encoding so that said signal is received by the radio-frequency transceiver in the absence of any applied magnetic-field gradient pulses and hence contains chemical-shift information.*

*138. The method of claim 75, wherein at least one navigator radio-frequency pulse is incorporated into the pulse sequence for the purpose of determining the displacement of a portion of the object.*

*139. The method of claim 75, wherein said flip angles and phase angles for said refocusing radio-frequency pulses are, in addition, selected to increase the number of echoes in at least one spin-echo train compared to the number which would be achieved by using said turbo-spin-echo or fast-spin-echo spin-echo-train pulse sequence.*

*140. A method for generating a spin-echo pulse sequence for operating a magnetic resonance imaging apparatus for imaging an object, said method comprising:*

*calculating flip angles and phase angles of refocusing radio-frequency pulses that are applied in a data-acquisition step,*

*wherein, to permit during said data-acquisition step at least one of lengthening usable echo-train duration, reducing power deposition and incorporating desired image contrast into the signal evolutions, said calculation provides flip angles and phase angles to yield a signal evolution for the associated train of spin echoes for at least one first substance of interest in said object, with corresponding T1 and T2 relaxation times and spin density of interest, and to yield a signal evolution for the associated train of spin echoes for at*

*least one second substance of interest in said object, with corresponding T1 and T2 relaxation times and spin density of interest,*

*wherein said signal evolutions result in T2-weigthed contrast in the corresponding image(s) that is substantially the same as T2-weighted contrast that would be provided by imaging said object by using a turbo-spin-echo or fast-spin-echo spin-echo-train pulse sequence that has constant flip angles, with values of 180 degrees, for the refocusing radio-frequency pulses, and*

*wherein at least one of the duration of the spin-echo trains for said signal evolutions for said substances is at least twice the duration of the spin-echo train for said turbo-spin-echo or fast-spin-echo spin-echo-train pulse sequence and an effective echo time corresponding to said spin-echo trains for said signal evolutions for said substances is at least twice an effective echo time for said turbo-spin-echo or fast-spin-echo spin-echo-train pulse sequence;*

*providing said data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle as determined by said calculation step;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding; and*

*repeating at least one of said calculating flip angles and phase angles and said data-acquisition step until a predetermined extent of spatial frequency space has been sampled.*

*141. A method for generating a spin-echo pulse sequence for operating a magnetic resonance imaging apparatus for imaging an object, said method comprising:*

*providing a data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle,*

*wherein, to permit during said data-acquisition step at least one of lengthening usable echo-train duration, reducing power deposition and incorporating desired image contrast into the signal evolutions, said flip angles for said refocusing radio-frequency pulses are selected to vary among pulses to yield a signal evolution for the associated train of spin echoes for at least one substance of interest in said object, with corresponding T1 and T2 relaxation times and spin density of interest, and*

*wherein said flip angles for said refocusing radio-frequency pulses decrease, within the first approximately 15% of the total number of echoes, to a value that is no more than approximately one-third of the initial flip angle for said refocusing radio-frequency pulses, and said flip angles then increase for the remaining echoes in said train of spin echoes;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding;*

*providing a magnetization-recovery step, said magnetization-recovery step comprises at least one of a time delay and at least one magnetic-field gradient pulse; and*

*repeating at least one of said data-acquisition step and said magnetization-recovery step until a predetermined extent of spatial frequency space has been sampled.*

*142. The method of claim 141, wherein said flip angles for said refocusing radio-frequency pulses are also selected to vary among pulses to yield a signal evolution for the associated train of spin echoes for at least one additional substance of interest in said object, with corresponding T1 and T2 relaxation times and spin density of interest, and wherein said signal evolutions corresponding to said substance in the method of claim 141 and said additional substance result in T2-weighted contrast in the corresponding image(s) that is substantially the same as T2-weighted contrast that would be provided by imaging said object by using a turbo-spin-echo or fast-spin-echo spin-echo-train pulse sequence that has constant flip angles, with values of 180 degrees, for the refocusing radio-frequency pulses, and that has an effective echo time typical for T2-weighted clinical magnetic resonance imaging.*

*143. The method of claim 142, wherein the duration of the spin-echo trains for said signal evolutions for said substances is at least twice the duration of the spin-echo train for said turbo-spin-echo or fast-spin-echo spin-echo-train pulse sequence and an effective echo time corresponding to said spin-echo trains for said signal evolutions for said substances is at least twice said effective echo time for said turbo-spin-echo or fast-spin-echo spin-echo-train pulse sequence.*

*144. The method of claim 142, wherein the duration of the spin-echo trains for said signal evolutions for said substances is greater than approximately four times the T2 relaxation time for at least one of said substances.*

*145. The method of claim 142, wherein an effective echo time corresponding to said spin-echo trains for said signal evolutions for said substances is greater than approximately two times the T2 relaxation time for at least one of said substances.*

*146. The method of claim 141, wherein said flip angles and phase angles for the refocusing radio-frequency pulses are calculated using an appropriate analytical or computer-based algorithm, either prior to or substantially simultaneous with the execution of the pulse sequence.*

*147. The method of claim 141, wherein a contrast preparation comprising generating at least one of at least one radio-frequency pulse, at least one magnetic-field gradient pulse, and at least one time delay, whereby said contrast preparation encodes the magnetization with at least one desired image contrast, immediately precedes at least one of said excitation radio-frequency pulses.*

*148. The method of claim 141, wherein a three-dimensional volume of spatial-frequency space is sampled.*

149. The method of claim 141, wherein at least one said data-acquisition step is initiated by a trigger signal to synchronize the pulse sequence with at least one of at least one external temporal event and at least one internal temporal event.

150. The method of claim 141, wherein the spatial-encoding magnetic-field gradient pulses applied during each said data-acquisition step are configured so as to collect data, following each of at least one of the refocusing radio-frequency pulses, for one line in spatial-frequency space which is parallel to all other lines of data so collected, so as to collect the data using a magnetic resonance imaging technique selected from the group consisting of rapid acquisition with relaxation enhancement (RARE), fast spin echo (FSE), and turbo spin echo (TSE or TurboSE).

151. The method of claim 141, wherein said flip angles for said refocusing radio-frequency pulses reach, at 50% of the total number of echoes in said train of spin echoes, a value approximately midway between said initial flip angle and the lowest flip angle.

152. A method for generating a spin-echo pulse sequence for operating a magnetic resonance imaging apparatus for imaging an object, said method comprising:

calculating flip angles of refocusing radio-frequency pulses that are applied in a data-acquisition step, wherein, to permit during said data-acquisition step at least one of lengthening usable echo-train duration, reducing power deposition and incorporating desired image contrast into the signal evolutions, said calculation provides flip angles to yield a signal evolution for the associated train of spin echoes for at least one substance of interest in said object, with corresponding T1 and T2 relaxation times and spin density of interest, wherein said flip angles for said refocusing radio-frequency pulses decrease, within the first approximately 15% of the total number of echoes, to a value that is no more than approximately one-third of the initial flip angle for said refocusing radio-frequency pulses, and said flip angles then increase for the remaining echoes in said train of spin echoes;

providing said data-acquisition step based on a spin-echo-train pulse sequence, said data-acquisition step comprises:

providing an excitation radio-frequency pulse having a flip angle and phase angle;

providing at least two refocusing radio-frequency pulses, each having a flip angle and phase angle with said flip angles determined by said calculation step;

providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and providing data sampling, associated with magnetic-field gradient pulses that perform spatial encoding;

providing a magnetization-recovery step, said magnetization-recovery step comprises at least one of a time delay and at least one magnetic-field gradient pulse; and repeating at least one of said calculating flip angles, said data-acquisition step and said magnetization-recovery step until a predetermined extent of spatial frequency space has been sampled.

153. A method for generating a spin-echo pulse sequence for operating a magnetic resonance imaging apparatus for imaging an object, said method comprising:

providing a data-acquisition step based on a spin-echo-train pulse sequence, said data-acquisition step comprises:

providing an excitation radio-frequency pulse having a flip angle and phase angle;

providing at least two refocusing radio-frequency pulses, each having a flip angle and phase angle, wherein, to permit during said data-acquisition step at least one of lengthening usable echo-train duration, reducing power deposition and incorporating desired image contrast into the signal evolutions, at least one of said angles is selected to vary among pulses to yield a signal evolution for the associated train of spin echoes for at least one substance of interest in said object, with corresponding T1 and T2 relaxation times and spin density of interest, and wherein, for said signal evolution for said substance, the signal amplitude decreases, within the first approximately 20% of the total number of echoes, to a value that is no more than approximately two-thirds of the initial value for said signal evolution, and the signal amplitude is then substantially constant up to at least approximately 50% of the total number of echoes;

providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and providing data sampling, associated with magnetic-field gradient pulses that perform spatial encoding;

providing a magnetization-recovery step, said magnetization-recovery step comprises at least one of a time delay and at least one magnetic-field gradient pulse; and repeating at least one of said data-acquisition step and said magnetization-recovery step until a predetermined extent of spatial frequency space has been sampled.

154. The method of claim 153, wherein at least one of said signal amplitude decreases within the first approximately 15% of the total number of echoes and said signal amplitude decreases to a value that is no more than approximately one-half of the initial value for said signal evolution.

155. The method of claim 153, wherein said signal amplitude decreases within the first approximately 15% of the total number of echoes and said signal amplitude decreases to a value that is no more than approximately one-half of the initial value for said signal evolution.

156. A method for generating a spin-echo pulse sequence for operating a magnetic resonance imaging apparatus for imaging an object, said method comprising:

calculating flip angles and phase angles of refocusing radio-frequency pulses that are applied in a data-acquisition step, wherein, to permit during said data-acquisition step at least one of lengthening usable echo-train duration, reducing power deposition and incorporating desired image contrast into the signal evolutions, said calculation provides flip angles and phase angles to yield a signal evolution for the associated train of spin echoes for at least one substance of interest in said object,

*with corresponding T1 and T2 relaxation times and spin density of interest, and*

*wherein, for said signal evolution for said substance, the signal amplitude decreases, within the first approximately 20% of the total number of echoes, to a value that is no more than approximately two-thirds of the initial value for said signal evolution, and the signal amplitude is then substantially constant up to at least approximately 50% of the total number of echoes;*

*providing said data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle as determined by said calculation step;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding;*

*providing a magnetization-recovery step, said magnetization-recovery step comprises at least one of a time delay and at least one magnetic-field gradient pulse; and*

*repeating at least one of said calculating flip angles and phase angles, said data-acquisition step and said magnetization-recovery step until a predetermined extent of spatial frequency space has been sampled.*

*157. A magnetic resonance imaging apparatus generating a spin-echo pulse sequence configured for operating said magnetic resonance imaging apparatus that is configured for imaging an object, the apparatus comprising:*

*a main magnet system generating a steady magnetic field;*

*a gradient magnet system generating temporary gradient magnetic fields;*

*a radio-frequency transmitter system generating radio-frequency pulses;*

*a radio-frequency receiver system receiving magnetic resonance signals;*

*a reconstruction unit reconstructing an image of the object from the received magnetic resonance signals; and*

*a control unit generating signals controlling the gradient magnet system, the radio-frequency transmitter system, the radio-frequency receiver system, and the reconstruction unit, wherein the control unit generates signals causing:*

*providing a data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle,*

*wherein, to permit during said data-acquisition step at least one of lengthening usable echo-train duration, reducing power deposition and incorporating desired image contrast into the signal evolutions, at least one of said angles is selected to vary among pulses to yield a signal evolution for the associated train of spin echoes for at least one first substance of interest in said object, with corresponding T1 and T2 relaxation times and spin density of interest, and to yield a signal evolution for the associated train of spin echoes for at least one second substance of interest in said object, with corresponding T1 and T2 relaxation times and spin density of interest,*

*wherein said signal evolutions result in T2-weighted contrast in the corresponding image(s) that is substantially the same as T2-weighted contrast that would be provided by imaging said object by using a turbo-spin-echo or fast-spin-echo spin-echo-train pulse sequence that has constant flip angles, with values of 180 degrees, for the refocusing radio-frequency pulses, and*

*wherein at least one of the duration of the spin-echo trains for said signal evolutions for said substances is at least twice the duration of the spin-echo train for said turbo-spin-echo or fast-spin-echo spin-echo-train pulse sequence and an effective echo time corresponding to said spin-echo trains for said signal evolutions for said substances is at least twice an effective echo time for said turbo-spin-echo or fast-spin-echo spin-echo-train pulse sequence;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding; and*

*repeating said data-acquisition step until a predetermined extent of spatial frequency space has been sampled.*

*158. A magnetic resonance imaging apparatus generating a spin-echo pulse sequence configured for operating said magnetic resonance imaging apparatus that is configured for imaging an object, the apparatus comprising:*

*a main magnet system generating a steady magnetic field;*

*a gradient magnet system generating temporary gradient magnetic fields;*

*a radio-frequency transmitter system generating radio-frequency pulses;*

*a radio-frequency receiver system receiving magnetic resonance signals;*

*a reconstruction unit reconstructing an image of the object from the received magnetic resonance signals; and*

*a control unit generating signals controlling the gradient magnet system, the radio-frequency transmitter system, the radio-frequency receiver system, and the reconstruction unit, wherein the control unit generates signals causing:*

*calculating flip angles and phase angles of refocusing radio-frequency pulses that are applied in a data-acquisition step,*

*wherein, to permit during said data-acquisition step at least one of lengthening usable echo-train duration, reducing power deposition and incorporating desired image contrast into the signal evolutions, said calculation provides flip angles and phase angles to yield a signal evolution for the associated train of spin echoes for at least one first substance of interest in said object, with corresponding T1 and T2 relaxation times and spin density of interest, and to yield a signal evolution for the associated train of spin echoes for at*

*least one second substance of interest in said object, with corresponding T1 and T2 relaxation times and spin density of interest,*

*wherein said signal evolutions result in T2-weighted contrast in the corresponding image(s) that is substantially the same as T2-weighted contrast that would be provided by imaging said object by using a turbo-spin-echo or fast-spin-echo spin-echo-train pulse sequence that has constant flip angles, with values of 180 degrees, for the refocusing radio-frequency pulses, and*

*wherein at least one of the duration of the spin-echo trains for said signal evolutions for said substances is at least twice the duration of the spin-echo train for said turbo-spin-echo or fast-spin-echo spin-echo-train pulse sequence and an effective echo time corresponding to said spin-echo trains for said signal evolutions for said substances is at least twice an effective echo time for said turbo-spin-echo or fast-spin-echo spin-echo-train pulse sequence;*

*providing said data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle as determined by said calculation step;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding; and*

*repeating at least one of said calculating flip angles and phase angles and said data-acquisition step until a predetermined extent of spatial frequency space has been sampled.*

*159. A magnetic resonance imaging apparatus generating a spin-echo pulse sequence configured for operating said magnetic resonance imaging apparatus that is configured for imaging an object, the apparatus comprising:*

*a main magnet system generating a steady magnetic field;*

*a gradient magnet system generating temporary gradient magnetic fields;*

*a radio-frequency transmitter system generating radio-frequency pulses;*

*a radio-frequency receiver system receiving magnetic resonance signals;*

*a reconstruction unit reconstructing an image of the object from the received magnetic resonance signals; and*

*a control unit generating signals controlling the gradient magnet system, the radio-frequency transmitter system, the radio-frequency receiver system, and the reconstruction unit, wherein the control unit generates signals causing:*

*providing a data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle,*

*wherein, to permit during said data-acquisition step at least one of lengthening usable echo-train duration, reducing power deposition and incorporating desired image contrast into the signal evolutions, said flip angles for said refocusing radio-frequency pulses are selected to vary among pulses to yield a signal evolution for the associated train of spin echoes for at least one substance of interest in said object, with corresponding T1 and T2 relaxation times and spin density of interest, and*

*wherein said flip angles for said refocusing radio-frequency pulses decrease, within the first approximately 15% of the total number of echoes, to a value that is no more than approximately one-third of the initial flip angle for said refocusing radio-frequency pulses, and said flip angles then increase for the remaining echoes in said train of spin echoes;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding;*

*providing a magnetization-recovery step, said magnetization-recovery step comprises at least one of a time delay and at least one magnetic-field gradient pulse; and*

*repeating at least one of said data-acquisition step and said magnetization-recovery step until a predetermined extent of spatial frequency space has been sampled.*

*160. A magnetic resonance imaging apparatus generating a spin-echo pulse sequence configured for operating said magnetic resonance imaging apparatus that is configured for imaging an object, the apparatus comprising:*

*a main magnet system generating a steady magnetic field;*

*a gradient magnet system generating temporary gradient magnetic fields;*

*a radio-frequency transmitter system generating radio-frequency pulses;*

*a radio-frequency receiver system receiving magnetic resonance signals;*

*a reconstruction unit reconstructing an image of the object from the received magnetic resonance signals; and*

*a control unit generating signals controlling the gradient magnet system, the radio-frequency transmitter system, the radio-frequency receiver system, and the reconstruction unit, wherein the control unit generates signals causing:*

*calculating flip angles of refocusing radio-frequency pulses that are applied in a data-acquisition step,*

*wherein, to permit during said data-acquisition step at least one of lengthening usable echo-train duration, reducing power deposition and incorporating desired image contrast into the signal evolutions, said calculation provides flip angles to yield a signal evolution for the associated train of spin echoes for at least one substance of interest in said object, with corresponding T1 and T2 relaxation times and spin density of interest,*

*wherein said flip angles for said refocusing radio-frequency pulses decrease, within the first approximately 15% of the total number of echoes, to a value that is no more than approximately one-third of the initial flip*

*angle for said refocusing radio-frequency pulses, and said flip angles then increase for the remaining echoes in said train of spin echoes;*

*providing said data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle with said flip angles determined by said calculation step;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding;*

*providing a magnetization-recovery step, said magnetization-recovery step comprises at least one of a time delay and at least one magnetic-field gradient pulse; and*

*repeating at least one of said calculating flip angles, said data-acquisition step and said magnetization-recovery step until a predetermined extent of spatial frequency space has been sampled.*

*161. A magnetic resonance imaging apparatus generating a spin-echo pulse sequence configured for operating said magnetic resonance imaging apparatus that is configured for imaging an object, the apparatus comprising:*

*a main magnet system generating a steady magnetic field;*

*a gradient magnet system generating temporary gradient magnetic fields;*

*a radio-frequency transmitter system generating radio-frequency pulses;*

*a radio-frequency receiver system receiving magnetic resonance signals;*

*a reconstruction unit reconstructing an image of the object from the received magnetic resonance signals; and*

*a control unit generating signals controlling the gradient magnet system, the radio-frequency transmitter system, the radio-frequency receiver system, and the reconstruction unit, wherein the control unit generates signals causing:*

*providing a data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle,*

*wherein, to permit during said data-acquisition step at least one of lengthening usable echo-train duration, reducing power deposition and incorporating desired image contrast into the signal evolutions, at least one of said angles is selected to vary among pulses to yield a signal evolution for the associated train of spin echoes for at least one substance of interest in said object, with corresponding T1 and T2 relaxation times and spin density of interest, and*

*wherein, for said signal evolution for said substance, the signal amplitude decreases, within the first approximately 20% of the total number of echoes, to a value that is no more than approximately two-thirds of the initial value for said signal evolution, and the signal amplitude is then substantially constant up to at least approximately 50% of the total number of echoes;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding;*

*providing a magnetization-recovery step, said magnetization-recovery step comprises at least one of a time delay and at least one magnetic-field gradient pulse; and*

*repeating at least one of said data-acquisition step and said magnetization-recovery step until a predetermined extent of spatial frequency space has been sampled.*

*162. A magnetic resonance imaging apparatus generating a spin-echo pulse sequence configured for operating said magnetic resonance imaging apparatus that is configured for imaging an object, the apparatus comprising:*

*a main magnet system generating a steady magnetic field;*

*a gradient magnet system generating temporary gradient magnetic fields;*

*a radio-frequency transmitter system generating radio-frequency pulses;*

*a radio-frequency receiver system receiving magnetic resonance signals;*

*a reconstruction unit reconstructing an image of the object from the received magnetic resonance signals; and*

*a control unit generating signals controlling the gradient magnet system, the radio-frequency transmitter system, the radio-frequency receiver system, and the reconstruction unit, wherein the control unit generates signals causing:*

*calculating flip angles and phase angles of refocusing radio-frequency pulses that are applied in a data-acquisition step,*

*wherein, to permit during said data-acquisition step at least one of lengthening usable echo-train duration, reducing power deposition and incorporating desired image contrast into the signal evolutions, said calculation provides flip angles and phase angles to yield a signal evolution for the associated train of spin echoes for at least one substance of interest in said object, with corresponding T1 and T2 relaxation times and spin density of interest, and*

*wherein, for said signal evolution for said substance, the signal amplitude decreases, within the first approximately 20% of the total number of echoes, to a value that is no more than approximately two-thirds of the initial value for said signal evolution, and the signal amplitude is then substantially constant up to at least approximately 50% of the total number of echoes;*

*providing said data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle as determined by said calculation step;*

*providing magnetic-field gradient pulses that perform at least one of encoding spatial information into at least one of the radio-frequency magnetic resonance sig-*

*nals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding;*

*providing a magnetization-recovery step, said magnetization-recovery step comprises at least one of a time delay and at least one magnetic-field gradient pulse; and*

*repeating at least one of said calculating flip angles and phase angles, said data-acquisition step and said magnetization-recovery step until a predetermined extent of spatial frequency space has been sampled.*

*163. A magnetic resonance imaging means generating a spin-echo pulse sequence configured for operating said magnetic resonance imaging means that is configured for imaging an object, the imaging means comprising:*

*a main magnet means for generating a steady magnetic field;*

*a gradient magnet means for generating temporary gradient magnetic fields;*

*a radio-frequency transmitter means for generating radio-frequency pulses;*

*a radio-frequency receiver means for receiving magnetic resonance signals;*

*a reconstruction means for reconstructing an image of the object from the received magnetic resonance signals; and*

*a control means for generating signals controlling the gradient magnet means, the radio-frequency transmitter means, the radio-frequency receiver means, and the reconstruction means, wherein the control means generates signals causing:*

*providing a data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle,*

*wherein, to permit during said data-acquisition step at least one of lengthening usable echo-train duration, reducing power deposition and incorporating desired image contrast into the signal evolutions, at least one of said angles is selected to vary among pulses to yield a signal evolution for the associated train of spin echoes for at least one first substance of interest in said object, with corresponding T1 and T2 relaxation times and spin density of interest, and to yield a signal evolution for the associated train of spin echoes for at least one second substance of interest in said object, with corresponding T1 and T2 relaxation times and spin density of interest,*

*wherein said signal evolutions result in T2-weighted contrast in the corresponding image(s) that is substantially the same as T2-weighted contrast that would be provided by imaging said object by using a turbo-spin-echo or fast-spin-echo spin-echo-train pulse sequence that has constant flip angles, with values of 180 degrees, for the refocusing radio-frequency pulses, and*

*wherein at least one of the duration of the spin-echo trains for said signal evolutions for said substances is at least twice the duration of the spin-echo train for said turbo-spin-echo or fast-spin-echo spin-echo-train pulse sequence and an effective echo time corresponding to said spin-echo trains for said signal evolutions for said substances is at least twice an effective echo time for said turbo-spin-echo or fast-spin-echo spin-echo-train pulse sequence;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding; and*

*repeating said data-acquisition step until a predetermined extent of spatial frequency space has been sampled.*

*164. A magnetic resonance imaging means generating a spin-echo pulse sequence configured for operating said magnetic resonance imaging means that is configured for imaging an object, the imaging means comprising:*

*a main magnet means for generating a steady magnetic field;*

*a gradient magnet means for generating temporary gradient magnetic fields;*

*a radio-frequency transmitter means for generating radio-frequency pulses;*

*a radio-frequency receiver means for receiving magnetic resonance signals;*

*a reconstruction means for reconstructing an image of the object from the received magnetic resonance signals; and*

*a control means for generating signals controlling the gradient magnet means, the radio-frequency transmitter means, the radio-frequency receiver means, and the reconstruction means, wherein the control means generates signals causing:*

*calculating flip angles and phase angles of refocusing radio-frequency pulses that are applied in a data-acquisition step,*

*wherein, to permit during said data-acquisition step at least one of lengthening usable echo-train duration, reducing power deposition and incorporating desired image contrast into the signal evolutions, said calculation provides flip angles and phase angles to yield a signal evolution for the associated train of spin echoes for at least one first substance of interest in said object, with corresponding T1 and T2 relaxation times and spin density of interest, and to yield a signal evolution for the associated train of spin echoes for at least one second substance of interest in said object, with corresponding T1 and T2 relaxation times and spin density of interest,*

*wherein said signal evolutions result in T2-weighted contrast in the corresponding image(s) that is substantially the same as T2-weighted contrast that would be provided by imaging said object by using a turbo-spin-echo or fast-spin-echo spin-echo-train pulse sequence that has constant flip angles, with values of 180 degrees, for the refocusing radio-frequency pulses, and*

*wherein at least one of the duration of the spin-echo trains for said signal evolutions for said substances is at least twice the duration of the spin-echo train for said turbo-spin-echo or fast-spin-echo spin-*

*echo-train pulse sequence and an effective echo time corresponding to said spin-echo trains for said signal evolutions for said substances is at least twice an effective echo time for said turbo-spin-echo or fast-spin-echo spin-echo-train pulse sequence;*

*providing said data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle as determined by said calculation step;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding; and*

*repeating at least one of said calculating flip angles and phase angles and said data-acquisition step until a predetermined extent of spatial frequency space has been sampled.*

*165. A magnetic resonance imaging means generating a spin-echo pulse sequence configured for operating said magnetic resonance imaging means that is configured for imaging an object, the imaging means comprising:*

*a main magnet means for generating a steady magnetic field;*

*a gradient magnet means for generating temporary gradient magnetic fields;*

*a radio-frequency transmitter means for generating radio-frequency pulses;*

*a radio-frequency receiver means for receiving magnetic resonance signals;*

*a reconstruction means for reconstructing an image of the object from the received magnetic resonance signals; and*

*a control means for generating signals controlling the gradient magnet means, the radio-frequency transmitter means, the radio-frequency receiver means, and the reconstruction means, wherein the control means generates signals causing:*

*providing a data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle,*

*wherein, to permit during said data-acquisition step at least one of lengthening usable echo-train duration, reducing power deposition and incorporating desired image contrast into the signal evolutions, said flip angles for said refocusing radio-frequency pulses are selected to vary among pulses to yield a signal evolution for the associated train of spin echoes for at least one substance of interest in said object, with corresponding T1 and T2 relaxation times and spin density of interest, and*

*wherein said flip angles for said refocusing radio-frequency pulses decrease, within the first approximately 15% of the total number of echoes, to a value that is no more than approximately one-third of the initial flip angle for said refocusing radio-frequency pulses, and said flip angles then increase for the remaining echoes in said train of spin echoes;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding;*

*providing a magnetization-recovery step, said magnetization-recovery step comprises at least one of a time delay and at least one magnetic-field gradient pulse; and*

*repeating at least one of said data-acquisition step and said magnetization-recovery step until a predetermined extent of spatial frequency space has been sampled.*

*166. A magnetic resonance imaging means generating a spin-echo pulse sequence configured for operating said magnetic resonance imaging means that is configured for imaging an object, the imaging means comprising:*

*a main magnet means for generating a steady magnetic field;*

*a gradient magnet means for generating temporary gradient magnetic fields;*

*a radio-frequency transmitter means for generating radio-frequency pulses;*

*a radio-frequency receiver means for receiving magnetic resonance signals;*

*a reconstruction means for reconstructing an image of the object from the received magnetic resonance signals; and*

*a control means for generating signals controlling the gradient magnet means, the radio-frequency transmitter means, the radio-frequency receiver means, and the reconstruction means, wherein the control means generates signals causing:*

*calculating flip angles of refocusing radio-frequency pulses that are applied in a data-acquisition step,*

*wherein, to permit during said data-acquisition step at least one of lengthening usable echo-train duration, reducing power deposition and incorporating desired image contrast into the signal evolutions, said calculation provides flip angles to yield a signal evolution for the associated train of spin echoes for at least one substance of interest in said object, with corresponding T1 and T2 relaxation times and spin density of interest,*

*wherein said flip angles for said refocusing radio-frequency pulses decrease, within the first approximately 15% of the total number of echoes, to a value that is no more than approximately one-third of the initial flip angle for said refocusing radio-frequency pulses, and said flip angles then increase for the remaining echoes in said train of spin echoes;*

*providing said data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle with said flip angles determined by said calculation step;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding;*

*providing a magnetization-recovery step, said magnetization-recovery step comprises at least one of a time delay and at least one magnetic-field gradient pulse; and*

*repeating at least one of said calculating flip angles, said data-acquisition step and said magnetization-recovery step until a predetermined extent of spatial frequency space has been sampled.*

*167. A magnetic resonance imaging means generating a spin-echo pulse sequence configured for operating said magnetic resonance imaging means that is configured for imaging an object, the imaging means comprising:*

*a main magnet means for generating a steady magnetic field;*

*a gradient magnet means for generating temporary gradient magnetic fields;*

*a radio-frequency transmitter means for generating radio-frequency pulses;*

*a radio-frequency receiver means for receiving magnetic resonance signals;*

*a reconstruction means for reconstructing an image of the object from the received magnetic resonance signals; and*

*a control means for generating signals controlling the gradient magnet means, the radio-frequency transmitter means, the radio-frequency receiver means, and the reconstruction means, wherein the control means generates signals causing:*

*providing a data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle,*

*wherein, to permit during said data-acquisition step at least one of lengthening usable echo-train duration, reducing power deposition and incorporating desired image contrast into the signal evolutions, at least one of said angles is selected to vary among pulses to yield a signal evolution for the associated train of spin echoes for at least one substance of interest in said object, with corresponding T1 and T2 relaxation times and spin density of interest, and*

*wherein, for said signal evolution for said substance, the signal amplitude decreases, within the first approximately 20% of the total number of echoes, to a value that is no more than approximately two-thirds of the initial value for said signal evolution, and the signal amplitude is then substantially constant up to at least approximately 50% of the total number of echoes;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding;*

*providing a magnetization-recovery step, said magnetization-recovery step comprises at least one of a time delay and at least one magnetic-field gradient pulse; and*

*repeating at least one of said data-acquisition step and said magnetization-recovery step until a predetermined extent of spatial frequency space has been sampled.*

*168. A magnetic resonance imaging means generating a spin-echo pulse sequence configured for operating said magnetic resonance imaging means that is configured for imaging an object, the imaging means comprising:*

*a main magnet means for generating a steady magnetic field;*

*a gradient magnet means for generating temporary gradient magnetic fields;*

*a radio-frequency transmitter means for generating radio-frequency pulses;*

*a radio-frequency receiver means for receiving magnetic resonance signals;*

*a reconstruction means for reconstructing an image of the object from the received magnetic resonance signals; and*

*a control means for generating signals controlling the gradient magnet means, the radio-frequency transmitter means, the radio-frequency receiver means, and the reconstruction means, wherein the control means generates signals causing:*

*calculating flip angles and phase angles of refocusing radio-frequency pulses that are applied in a data-acquisition step,*

*wherein, to permit during said data-acquisition step at least one of lengthening usable echo-train duration, reducing power deposition and incorporating desired image contrast into the signal evolutions, said calculation provides flip angles and phase angles to yield a signal evolution for the associated train of spin echoes for at least one substance of interest in said object, with corresponding T1 and T2 relaxation times and spin density of interest, and*

*wherein, for said signal evolution for said substance, the signal amplitude decreases, within the first approximately 20% of the total number of echoes, to a value that is no more than approximately two-thirds of the initial value for said signal evolution, and the signal amplitude is then substantially constant up to at least approximately 50% of the total number of echoes;*

*providing said data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle as determined by said calculation step;*

*providing magnetic-field gradient pulses that perform at least one of encoding spatial information into at least one of the radio-frequency magnetic resonance signals that follow at least one of said refocusing radio-frequency pulses and dephasing transverse magneti-*

*zation associated with undesired signal pathways to reduce or eliminate contribution of said transverse magnetization to sampled signals; and*

*providing data sampling, associated with magnetic-field gradient pulses that perform spatial encoding;*

*providing a magnetization-recovery step, said magnetization-recovery step comprises at least one of a time delay and at least one magnetic-field gradient pulse; and*

*repeating at least one of said calculating flip angles and phase angles, said data-acquisition step and said magnetization-recovery step until a predetermined extent of spatial frequency space has been sampled.*

*169. The method of claim 80, wherein at least one of said effective echo time corresponding to said spin-echo trains for said signal evolutions for said substances is at least on the order of 300 milliseconds and said duration of the spin-echo trains for said signal evolutions for said substances is at least on the order of 600 milliseconds.*

*170. The method of claim 169, wherein said effective echo time for said turbo-spin-echo or fast-spin-echo spin-echo-train pulse sequence has a value typical for T2-weighted clinical magnetic resonance imaging.*

*171. The method of claim 170, wherein a three-dimensional volume of spatial-frequency space is sampled.*

*172. The method of claim 171, wherein at least one of said duration of the spin-echo train for said turbo-spin-echo or fast-spin-echo spin-echo-train pulse sequence is less than 300 milliseconds and said effective echo time for said turbo-spin-echo or fast-spin-echo spin-echo-train pulse sequence has a value typical for T2-weighted clinical magnetic resonance imaging of the brain.*

*173. The method of claim 172, wherein said angles, selected to vary for said refocusing radio-frequency pulses, reduce power deposition by at least 30% compared to power deposition that would be achieved by using constant flip angles, with values of 180 degrees, for the refocusing radio-frequency pulses.*

*174. The method of claim 173, wherein the number of refocusing radio-frequency pulses following at least one said excitation radio-frequency pulse is greater than 50.*

*175. The method of claim 174, wherein said flip angles and phase angles for the refocusing radio-frequency pulses are calculated using an appropriate analytical or computer-based algorithm, either prior to or substantially simultaneous with the execution of the pulse sequence.*

*176. A method for generating a spin-echo pulse sequence for operating a magnetic resonance imaging apparatus for imaging an object, said method comprising:*

*providing a data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle,*

*wherein, to permit during said data-acquisition step at least one of lengthening usable echo-train duration, reducing power deposition and incorporating desired image contrast into the signal evolutions, at least one of said angles is selected to vary among pulses to yield a signal evolution for the associated train of spin echoes for at least one first substance of interest in said object, with corresponding T1 and T2 relaxation times and spin density of interest, and to yield a signal evolution for the associated train of spin echoes for at least one second substance of interest in said object, with corresponding T1 and T2 relaxation times and spin density of interest,*

*wherein said signal evolutions result in T2-weighted contrast in the corresponding image(s) that is substantially the same as T2-weighted contrast that would be provided by imaging said object by using a conventional spin-echo pulse sequence, and*

*wherein an effective echo time corresponding to said spin-echo trains for said signal evolutions for said substances is at least twice an echo time for said conventional spin-echo pulse sequence;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding; and*

*repeating said data-acquisition step until a predetermined extent of spatial frequency space has been sampled.*

*177. A magnetic resonance imaging apparatus generating a spin-echo pulse sequence configured for operating said magnetic resonance imaging apparatus that is configured for imaging an object, the apparatus comprising:*

*a main magnet system generating a steady magnetic field;*

*a gradient magnet system generating temporary gradient magnetic fields;*

*a radio-frequency transmitter system generating radio-frequency pulses;*

*a radio-frequency receiver system receiving magnetic resonance signals;*

*a reconstruction unit reconstructing an image of the object from the received magnetic resonance signals; and*

*a control unit generating signals controlling the gradient magnet system, the radio-frequency transmitter system, the radio-frequency receiver system, and the reconstruction unit, wherein the control unit generates signals causing:*

*providing a data-acquisition step based on a spin-echo-train pulse sequence, said data-acquisition step comprises:*

*providing an excitation radio-frequency pulse having a flip angle and phase angle;*

*providing at least two refocusing radio-frequency pulses, each having a flip angle and phase angle,*

*wherein, to permit during said data-acquisition step at least one of lengthening usable echo-train duration, reducing power deposition and incorporating desired image contrast into the signal evolutions, at least one of said angles is selected to vary among pulses to yield a signal evolution for the associated train of spin echoes for at least one first substance of interest in said object, with corresponding T1 and T2 relaxation times and spin density of interest, and to yield a signal evolution for the associated train of spin echoes for at least one second substance of interest in said object, with corresponding T1 and T2 relaxation times and spin density of interest,*

*wherein said signal evolutions result in T2-weighted contrast in the corresponding image(s) that is substantially the same as T2-weighted contrast that*

*would be provided by imaging said object by using a conventional spin-echo pulse sequence, and*

*wherein an effective echo time corresponding to said spin-echo trains for said signal evolutions for said substances is at least twice an echo time for said conventional spin-echo pulse sequence;*

*providing magnetic-field gradient pulses that perform at least one of encoding spatial information into at least one of the radio-frequency magnetic resonance signals that follow at least one of said refocusing radio-frequency pulses and dephasing transverse magnetization associated with undesired signal pathways to reduce or eliminate contribution of said transverse magnetization to sampled signals; and*

*providing data sampling, associated with magnetic-field gradient pulses that perform spatial encoding; and*

*repeating said data-acquisition step until a predetermined extent of spatial frequency space has been sampled.*

*178. The apparatus of claim 157, wherein at least one of a time delay and at least one magnetic-field gradient pulse occurs between the end of at least one spin-echo train and the excitation radio-frequency pulse associated with the next spin-echo train.*

*179. The apparatus of claim 157, wherein at least one repetition of said data-acquisition step is for the purpose of stabilizing the response of at least one of magnetization related system and apparatus related hardware system.*

*180. The apparatus of claim 157, wherein for at least one repetition of said data-acquisition step at least one of at least a fraction of the sampled data is discarded and no data is sampled.*

*181. The apparatus of claim 157, wherein said flip angles and phase angles for the refocusing radio-frequency pulses are calculated using an appropriate analytical or computer-based algorithm, either prior to or substantially simultaneous with the execution of the pulse sequence.*

*182. The apparatus of claim 157, wherein said flip angles for said refocusing radio-frequency pulses decrease, within the first approximately 15% of the total number of echoes, to a value that is no more than approximately one-third of the initial flip angle for said refocusing radio-frequency pulses, and said flip angles then increase for the remaining echoes in said train of spin echoes.*

*183. The apparatus of claim 182, wherein said flip angles for said refocusing radio-frequency pulses reach, at 50% of the total number of echoes in said train of spin echoes, a value approximately midway between said initial flip angle and the lowest flip angle.*

*184. The apparatus of claim 157, wherein said flip angles and phase angles for said refocusing radio-frequency pulses are, in addition, selected to reduce power deposition compared to power deposition that would be achieved by using constant flip angles, with values of 180 degrees, for the refocusing radio-frequency pulses.*

*185. The apparatus of claim 184, wherein the power deposition at a magnetic field strength of 3 Tesla for the apparatus of claim 157 is below regulatory limits while power deposition that would be achieved by using constant flip angles, with values of 180 degrees, for the refocusing radio-frequency pulses exceeds regulatory limits.*

*186. The apparatus of claim 157, wherein said effective echo time corresponding to said spin-echo trains for said signal evolutions for said substances is at least twice the effective echo time for said turbo-spin-echo or fast-spin-echo spin-echo-train pulse sequence and said duration of the spin-echo trains for said signal evolutions for said substances is at least twice said duration of the spin-echo train for said turbo-spin-echo or fast-spin-echo spin-echo-train pulse sequence.*

*187. The apparatus of claim 157, wherein at least one of said effective echo time corresponding to said spin-echo trains for said signal evolutions for said substances is at least on the order of 300 milliseconds and said duration of the spin-echo trains for said signal evolutions for said substances is at least on the order of 600 milliseconds.*

*188. The apparatus of claim 157, wherein said effective echo time corresponding to said spin-echo trains for said signal evolutions for said substances is at least on the order of 300 milliseconds and said duration of the spin-echo trains for said signal evolutions for said substances is at least on the order of 600 milliseconds.*

*189. The apparatus of claim 157, wherein said effective echo time for said turbo-spin-echo or fast-spin-echo spin-echo-train pulse sequence has a value typical for T2-weighted clinical magnetic resonance imaging.*

*190. The apparatus of claim 157, wherein said duration of the spin-echo trains for said signal evolutions for said substances is greater than approximately four times the T2 relaxation time for at least one of said substances.*

*191. The apparatus of claim 157, wherein said effective echo time corresponding to said spin-echo trains for said signal evolutions for said substances is greater than approximately two times the T2 relaxation time for at least one of said substances.*

*192. The apparatus of claim 157, wherein said first and second substances of interest are brain white matter and brain gray matter.*

*193. The apparatus of claim 192, wherein at least one of said duration of the spin-echo train for said turbo-spin-echo or fast-spin-echo spin-echo-train pulse sequence is less than 300 milliseconds and said effective echo time for said turbo-spin-echo or fast-spin-echo spin-echo-train pulse sequence has a value typical for T2-weighted clinical magnetic resonance imaging of the brain.*

*194. The apparatus of claim 157, wherein said first and second substances of interest are spinal cord white matter and spinal cord gray matter.*

*195. The apparatus of claim 157, wherein at least one of said substances of interest is at least one of cartilage, ligament and muscle.*

*196. The apparatus of claim 192, wherein said duration of the spin-echo train for said turbo-spin-echo or fast-spin-echo spin-echo-train pulse sequence is less than 300 milliseconds and said effective echo time for said turbo-spin-echo or fast-spin-echo spin-echo-train pulse sequence has a value typical for T2-weighted clinical magnetic resonance imaging of the brain.*

*197. The apparatus of claim 157, wherein the number of refocusing radio-frequency pulses following at least one said excitation radio-frequency pulse is greater than 50.*

*198. The apparatus of claim 157, wherein the number of refocusing radio-frequency pulses following at least one said excitation radio-frequency pulse is greater than 100.*

*199. The apparatus of claim 157, wherein a contrast preparation comprising generating at least one of at least one radio-frequency pulse, at least one magnetic-field gradient pulse, and at least one time delay, whereby said contrast preparation encodes the magnetization with at least one desired image contrast, immediately precedes at least one of said excitation radio-frequency pulses.*

*200. The apparatus of claim 199, wherein said contrast preparation comprises at least an inversion radio-frequency pulse followed by a time delay.*

*201. The apparatus of claim 200, wherein said time delay is chosen so that the longitudinal magnetization associated with fluid, such as cerebrospinal fluid, is passing through substantially zero when at least one said excitation radio-frequency pulse is applied.*

*202. The apparatus of claim 199, wherein at least one of the radio-frequency pulses is at least one of spatially selective in one of one, two and three dimensions, chemically selective, and adiabatic.*

*203. The apparatus of claim 199, wherein at least one said contrast preparation is initiated by a trigger signal to synchronize the pulse sequence with at least one of at least one external temporal event and at least one internal temporal event.*

*204. The apparatus of claim 203, wherein said external and internal events comprise at least one of at least one voluntary action, at least one involuntary action, at least one respiratory cycle and at least one cardiac cycle.*

*205. The apparatus of claim 199, wherein at least one of at least one radio-frequency pulse and at least one magnetic-field gradient pulse is applied as part of at least one said contrast preparation for the purpose of stabilizing the response of at least one of magnetization related system and apparatus related hardware system.*

*206. The apparatus of claim 157, wherein the flip angle for at least one of the refocusing radio-frequency pulses in the first half of at least one spin-echo train is chosen to be sufficiently low to cause the signal from flowing or pulsating fluid in resulting images to be suppressed.*

*207. The apparatus of claim 206, wherein said flip angle is less than 30 degrees.*

*208. The apparatus of claim 157, wherein a two-dimensional plane of spatial-frequency space is sampled.*

*209. The apparatus of claim 157, wherein a three-dimensional volume of spatial-frequency space is sampled.*

*210. The apparatus of claim 157, wherein at least one said data-acquisition step is initiated by a trigger signal to synchronize the pulse sequence with at least one of at least one external temporal event and at least one internal temporal event.*

*211. The apparatus of claim 210, wherein said external and internal events comprise at least one of at least one voluntary action, at least one involuntary action, at least one respiratory cycle and at least one cardiac cycle.*

*212. The apparatus of claim 157, wherein at least one of at least one radio-frequency pulse and at least one magnetic-field gradient pulse is applied as part of at least one said data-acquisition step for the purpose of stabilizing the response of at least one of magnetization related system and apparatus related hardware system.*

*213. The apparatus of claim 157, wherein the time periods between consecutive refocusing radio-frequency pulses applied during said data-acquisition steps are all of equal duration.*

*214. The apparatus of claim 157, wherein the time periods between consecutive refocusing radio-frequency pulses applied during said data-acquisition steps vary in duration amongst pairs of refocusing radio-frequency pulses during at least one said data-acquisition step.*

*215. The apparatus of claim 157 wherein all radio-frequency pulses are at least one of non-spatially selective and non-chemically selective.*

*216. The apparatus of claim 157, wherein at least one of the radio-frequency pulses is at least one of spatially selective in one of one, two and three dimensions, chemically selective, and adiabatic.*

*217. The apparatus of claim 157, wherein during at least one said data-acquisition step, the phase difference between the phase angle for the excitation radio-frequency pulse and the phase angles for all refocusing radio-frequency pulses is substantially 90 degrees.*

*218. The apparatus of claim 157, wherein during at least one said data-acquisition step, the phase difference between the phase angle for any refocusing radio-frequency pulse and the phase angle for the immediately subsequent refocusing radio-frequency pulse is substantially 180 degrees, and the phase difference between the phase angle for the excitation radio-frequency pulse and the phase angle for the first refocusing pulse is one of substantially 0 degrees and substantially 180 degrees.*

*219. The apparatus of claim 157, wherein the flip angle for the excitation radio-frequency pulse is substantially one-half of the flip angle for the first refocusing radio-frequency pulse.*

*220. The apparatus of claim 157, wherein the spatial-encoding magnetic-field gradient pulses applied during each said data-acquisition step are configured so as to collect data, following each of at least one of the refocusing radio-frequency pulses, for one line in spatial-frequency space which is parallel to all other lines of data so collected, so as to collect the data using a magnetic resonance imaging technique selected from the group consisting of rapid acquisition with relaxation enhancement (RARE), fast spin echo (FSE), and turbo spin echo (TSE or TurboSE).*

*221. The apparatus of claim 157, wherein the spatial-encoding magnetic-field gradient pulses applied during each said data-acquisition step are configured so as to collect data, following each of at least one of the refocusing radio-frequency pulses, for two or more lines in spatial-frequency space which are parallel to all other lines of data so collected, so as to collect the data using a magnetic resonance imaging technique selected from the group consisting of gradient and spin echo (GRASE) and turbo gradient spin echo (TGSE or TurboGSE).*

*222. The apparatus of claim 157, wherein the spatial-encoding magnetic-field gradient pulses applied during each said data-acquisition step are configured so as to collect data, following each of at least one of the refocusing radio-frequency pulses, for one or more lines in spatial-frequency space, each of which pass through one of a single point in spatial-frequency space and a single line in spatial-frequency space, so as to collect the data using a magnetic resonance imaging technique selected from the group consisting of radial sampling and projection-reconstruction sampling.*

*223. The apparatus of claim 222, wherein the single point in spatial-frequency space is substantially zero spatial frequency.*

*224. The apparatus of claim 222, wherein the single line in spatial-frequency space includes substantially zero spatial frequency.*

*225. The apparatus of 157, wherein the spatial-encoding magnetic-field gradient pulses applied during each said data-acquisition step are configured so as to collect data, following each of at least one of the refocusing radio-frequency pulses, along a spiral trajectory in spatial-frequency space, each trajectory of which is contained in one of two dimensions and three dimensions, and each trajectory of which passes through one of a single point in spatial-frequency space and a single line in spatial-frequency space.*

*226. The apparatus of claim 225, wherein the single point in spatial-frequency space is substantially zero spatial frequency.*

*227. The apparatus of claim 225, wherein the single line in spatial-frequency space includes substantially zero spatial frequency.*

*228. The apparatus of claim 157, wherein the spatial-encoding magnetic-field gradient pulses applied during at least one of said data-acquisition steps are configured to collect sufficient spatial-frequency data to reconstruct at least two image sets, each of which exhibits contrast properties different from the other image sets.*

*229. The apparatus of claim 228, wherein at least some of the spatial-frequency data collected during at least one of said data-acquisition steps is used in the reconstruction of more than one image set, whereby the data is shared between image sets.*

*230. The apparatus of claim 157, wherein the spatial-encoding magnetic-field gradient pulses applied during at least one of said data-acquisition steps are configured so that, for the echo following at least one of the refocusing radio-frequency pulses, at least one of the first moment, the second moment and the third moment corresponding to at least one of the spatial-encoding directions is approximately zero.*

*231. The apparatus of claim 157, wherein the spatial-encoding magnetic-field gradient pulses applied during at least one of said data-acquisition steps are configured so that, following at least one of the refocusing radio-frequency pulses, the zeroth moment measured over the time period between said refocusing radio-frequency pulse and the immediately consecutive refocusing radio-frequency pulse is approximately zero for at least one of the spatial-encoding directions.*

*232. The apparatus of claim 157, wherein during all said data-acquisition steps the duration of all data-sampling periods are equal.*

*233. The apparatus of claim 157, wherein during at least one of said data-acquisition steps at least one of the data-sampling periods has a duration that differs from the duration of at least one other data-sampling period.*

*234. The apparatus of claim 157, wherein the spatial-encoding magnetic-field gradient pulses applied during said data-acquisition steps are configured so that the extent of spatial-frequency space sampled along at least one of the spatial-encoding directions is not symmetric with respect to zero spatial frequency, whereby a larger extent of spatial-frequency space is sampled to one side of zero spatial frequency as compared to the opposite side of zero spatial frequency.*

*235. The apparatus of claim 234 wherein said spatial-frequency data is reconstructed using a partial-Fourier reconstruction algorithm.*

*236. The apparatus of claim 157, wherein during at least one of said data-acquisition steps the temporal order in which spatial-frequency data is collected for at least one of the spatial-encoding directions is based on achieving at least one of selected contrast properties in the image and selected properties of the corresponding point spread function.*

*237. The apparatus of claim 157, wherein during at least one of said data-acquisition steps the temporal order in which spatial-frequency data is collected is different from that for at least one other data-acquisition step.*

*238. The apparatus of claim 157, wherein during at least one of said data-acquisition steps the extent of spatial-frequency data that is collected is different from that for at least one other data-acquisition step.*

*239. The apparatus of claim 157, wherein during at least one of said data-acquisition steps spatial encoding of the radio-frequency magnetic resonance signal that follows at least one of the refocusing radio-frequency pulses is performed using only phase encoding so that said signal is received by the radio-frequency transceiver in the absence of any applied magnetic-field gradient pulses and hence contains chemical-shift information.*

*240. The apparatus of claim 157, wherein at least one navigator radio-frequency pulse is incorporated into the pulse sequence for the purpose of determining the displacement of a portion of the object.*

*241. The apparatus of claim 157, wherein said flip angles and phase angles for said refocusing radio-frequency pulses are, in addition, selected to increase the number of echoes in at least one spin-echo train compared to the number which would be achieved by using said turbo-spin-echo or fast-spin-echo spin-echo-train pulse sequence.*

*242. The apparatus of claim 159, wherein said flip angles for said refocusing radio-frequency pulses are also selected to vary among pulses to yield a signal evolution for the associated train of spin echoes for at least one additional substance of interest in said object, with corresponding T1 and T2 relaxation times and spin density of interest, and wherein said signal evolutions corresponding to said substance in apparatus of claim 159 and said additional substance result in T2-weighted contrast in the corresponding image(s) that is substantially the same as T2-weighted contrast that would be provided by imaging said object by using a turbo-spin-echo or fast-spin-echo spin-echo-train pulse sequence that has constant flip angles, with values of 180 degrees, for the refocusing radio-frequency pulses, and that has an effective echo time typical for T2-weighted clinical magnetic resonance imaging.*

*243. The apparatus of claim 242, wherein the duration of the spin-echo trains for said signal evolutions for said substances is at least twice the duration of the spin-echo train for said turbo-spin-echo or fast-spin-echo spin-echo-train pulse sequence and an effective echo time corresponding to said spin-echo trains for said signal evolutions for said substances is at least twice said effective echo time for said turbo-spin-echo or fast-spin-echo spin-echo-train pulse sequence.*

*244. The apparatus of claim 242, wherein the duration of the spin-echo trains for said signal evolutions for said substances is greater than approximately four times the T2 relaxation time for at least one of said substances.*

*245. The apparatus of claim 242, wherein an effective echo time corresponding to said spin-echo trains for said signal evolutions for said substances is greater than approximately two times the T2 relaxation time for at least one of said substances.*

*246. The apparatus of claim 159, wherein said flip angles and phase angles for the refocusing radio-frequency pulses are calculated using an appropriate analytical or computer-based algorithm, either prior to or substantially simultaneous with the execution of the pulse sequence.*

*247. The apparatus of claim 159, wherein a contrast preparation comprising generating at least one of at least one radio-frequency pulse, at least one magnetic-field gradient pulse, and at least one time delay, whereby said contrast preparation encodes the magnetization with at least one desired image contrast, immediately precedes at least one of said excitation radio-frequency pulses.*

*248. The apparatus of claim 159, wherein a three-dimensional volume of spatial-frequency space is sampled.*

*249. The apparatus of claim 159, wherein at least one said data-acquisition step is initiated by a trigger signal to synchronize the pulse sequence with at least one of at least one external temporal event and at least one internal temporal event.*

*250. The apparatus of claim 159, wherein the spatial-encoding magnetic-field gradient pulses applied during each said data-acquisition step are configured so as to collect data, following each of at least one of the refocusing radio-frequency pulses, for one line in spatial-frequency space which is parallel to all other lines of data so collected, so as to collect the data using a magnetic resonance imaging technique selected from the group consisting of rapid acquisition with relaxation enhancement (RARE), fast spin echo (FSE), and turbo spin echo (TSE or TurboSE).*

*251. The apparatus of claim 159, wherein said flip angles for said refocusing radio-frequency pulses reach, at 50% of the total number of echoes in said train of spin echoes, a value approximately midway between said initial flip angle and the lowest flip angle.*

*252. The apparatus of claim 161, wherein at least one of said signal amplitude decreases within the first approximately 15% of the total number of echoes and said signal amplitude decreases to a value that is no more than approximately one-half of the initial value for said signal evolution.*

*253. The apparatus of claim 161, wherein said signal amplitude decreases within the first approximately 15% of the total number of echoes and said signal amplitude decreases to a value that is no more than approximately one-half of the initial value for said signal evolution.*

*254. The apparatus of claim 182, wherein at least one of said effective echo time corresponding to said spin-echo trains for said signal evolutions for said substances is at least on the order of 300 milliseconds and said duration of the spin-echo trains for said signal evolutions for said substances is at least on the order of 600 milliseconds.*

*255. The apparatus of claim 254, wherein said effective echo time for said turbo-spin-echo or fast-spin-echo spin-echo-train pulse sequence has a value typical for T2-weighted clinical magnetic resonance imaging.*

*256. The apparatus of claim 255, wherein a three-dimensional volume of spatial-frequency space is sampled.*

*257. The apparatus of claim 256, wherein at least one of said duration of the spin-echo train for said turbo-spin-echo or fast-spin-echo spin-echo-train pulse sequence is less than 300 milliseconds and said effective echo time for said turbo-spin-echo or fast-spin-echo spin-echo-train pulse sequence has a value typical for T2-weighted clinical magnetic resonance imaging of the brain.*

*258. The apparatus of claim 257, wherein said angles, selected to vary for said refocusing radio-frequency pulses, reduce power deposition by at least 30% compared to power deposition that would be achieved by using constant flip angles, with values of 180 degrees, for the refocusing radio-frequency pulses.*

*259. The apparatus of claim 258, wherein the number of refocusing radio-frequency pulses following at least one said excitation radio-frequency pulse is greater than 50.*

*260. The apparatus of claim 259, wherein said flip angles and phase angles for the refocusing radio-frequency pulses are calculated using an appropriate analytical or computer-based algorithm, either prior to or substantially simultaneous with the execution of the pulse sequence.*

* * * * *

UNITED STATES PATENT AND TRADEMARK OFFICE

CERTIFICATE OF CORRECTION

PATENT NO. : RE44,644 E
APPLICATION NO. : 12/354471
DATED : December 17, 2013
INVENTOR(S) : Mugler, III et al.

It is certified that error appears in the above-identified patent and that said Letters Patent is hereby corrected as shown below:

In the Specification

Column 1, line 10, above the heading, "RELATED APPLICATIONS" insert

-- Notice: More than one reissue application has been filed for the reissue of U.S. Patent No. 7,164,268. The reissue applications are application numbers: 12/354,471, filed January 15, 2009, and issued as RE44,644 on December 17, 2013; 14/053,190 (a continuation reissue of 12/354,471), filed October 14, 2013; and 14/708,875 (a continuation reissue of 14/053,190). --.

Signed and Sealed this
Twenty-first Day of July, 2015

Michelle K. Lee

Michelle K. Lee
*Director of the United States Patent and Trademark Office*